US012701862B2

(12) United States Patent
Min et al.

(10) Patent No.: US 12,701,862 B2
(45) Date of Patent: Aug. 4, 2026

(54) DISPLAY DEVICE

(71) Applicant: Samsung Display Co., Ltd., Yongin-si (KR)

(72) Inventors: Junyoung Min, Yongin-si (KR); Jun-Yong An, Yongin-si (KR); Junwon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 475 days.

(21) Appl. No.: 18/316,528

(22) Filed: May 12, 2023

(65) Prior Publication Data

US 2024/0057383 A1 Feb. 15, 2024

(30) Foreign Application Priority Data

Aug. 9, 2022 (KR) ......................... 10-2022-0099469

(51) Int. Cl.
H10K 59/121 (2023.01)
H10K 59/122 (2023.01)
H10K 59/35 (2023.01)

(52) U.S. Cl.
CPC ....... H10K 59/1213 (2023.02); H10K 59/122 (2023.02); H10K 59/352 (2023.02)

(58) Field of Classification Search
CPC ............. H10K 59/1213; H10K 59/122; H10K 59/352; H10K 59/131; H10K 50/11; H10K 50/805; H10K 59/1216; H10K 59/351; H10K 59/353; H10D 30/6755; H10D 86/60
See application file for complete search history.

(56) References Cited

U.S. PATENT DOCUMENTS

| | | | |
|---|---|---|---|
| 7,791,074 B2 | 9/2010 | Iwasaki | |
| 10,084,029 B2 | 9/2018 | Lee | |
| 10,153,446 B2 | 12/2018 | Maruyama | |
| 10,236,332 B2 | 3/2019 | Jung et al. | |
| 10,761,632 B2 | 9/2020 | Hwang et al. | |
| 11,264,430 B2 | 3/2022 | Huangfu et al. | |
| 11,716,883 B2 | 8/2023 | Park et al. | |
| 2014/0246654 A1* | 9/2014 | Huang ................. | H10K 59/353 |
| | | | 257/40 |

(Continued)

FOREIGN PATENT DOCUMENTS

| | | |
|---|---|---|
| KR | 10-1051204 | 7/2011 |
| KR | 10-2014-0080629 A | 7/2014 |

(Continued)

*Primary Examiner* — Chad M Dicke
*Assistant Examiner* — Gary Abel
(74) *Attorney, Agent, or Firm* — F. CHAU & ASSOCIATES, LLC

(57) ABSTRACT

A display device including a base layer, a circuit layer including 1-1 and 1-2 pixel circuits, and a light emitting element layer including first and second light emitting elements each including a first electrode, an emission layer, a second electrode, and a pixel defining film. The 1-1 pixel circuit and the 1-2 pixel circuit each include a driving and a gate conductive layer. An area in which the first electrode of the first light emitting element overlaps the gate conductive layer of the 1-1 pixel circuit in plan view is equal to an area in which the first electrode of the second light emitting element overlaps the gate conductive layer of the 1-2 pixel circuit in plan view.

20 Claims, 14 Drawing Sheets

(56)  References Cited

U.S. PATENT DOCUMENTS

| | | | |
|---|---|---|---|
| 2016/0071910 A1* | 3/2016 | Sasaki | H10K 59/351 |
| | | | 257/89 |
| 2016/0148981 A1* | 5/2016 | Matsueda | H10K 59/353 |
| | | | 257/40 |
| 2017/0124953 A1* | 5/2017 | Shim | G09G 3/2018 |
| 2018/0062105 A1* | 3/2018 | Lius | H10K 59/1216 |
| 2019/0115407 A1* | 4/2019 | Cho | H10K 50/84 |
| 2021/0036067 A1* | 2/2021 | Kim | H10K 59/353 |
| 2021/0043707 A1* | 2/2021 | Park | H10K 59/1213 |
| 2021/0066644 A1* | 3/2021 | Lee | H10K 59/131 |
| 2021/0193893 A1* | 6/2021 | Choi | H01L 25/167 |
| 2021/0202595 A1* | 7/2021 | Lee | H10K 59/353 |
| 2021/0249482 A1 | 8/2021 | Lee et al. | |
| 2021/0327972 A1 | 10/2021 | Lou et al. | |
| 2022/0199694 A1 | 6/2022 | Bae et al. | |
| 2023/0309218 A1* | 9/2023 | Li | H10K 59/352 |
| 2024/0155905 A1* | 5/2024 | Zhu | H10K 59/128 |
| 2024/0321155 A1* | 9/2024 | Suyama | G09G 3/2074 |

FOREIGN PATENT DOCUMENTS

| | | |
|---|---|---|
| KR | 10-2017-0052776 A | 5/2017 |
| KR | 10-2019-0056921 | 5/2019 |
| KR | 10-2002686 | 7/2019 |
| KR | 10-2096051 | 4/2020 |
| KR | 10-2021-0103038 | 8/2021 |
| KR | 10-2022-0042007 | 4/2022 |
| KR | 10-2022-0087668 | 6/2022 |

* cited by examiner

DISPLAY DEVICE

CROSS-REFERENCE TO RELATED APPLICATION(S)

This U.S. non-provisional patent application claims priority to and benefits of Korean Patent Application No. 10-2022-0099469 under 35 U.S.C. § 119, filed on Aug. 9, 2022 in the Korean Intellectual Property Office, the entire contents of which are incorporated herein by reference.

BACKGROUND

1. Technical Field

This disclosure relates to a display device including an oxide transistor.

2. Description of the Related Art

Display devices include pixels and a driving circuit (e.g., a scan driving circuit and a data driving circuit) configured to control the pixels. The pixels each may include a display element and a pixel driving circuit configured to control the display element. The pixel driving circuit may include organically connected transistors.

The scan driving circuit and/or the data driving circuit may be formed through the same process as the pixels. The scan driving circuit and/or the data driving circuit may include organically connected transistors.

SUMMARY

The disclosure provides a display device having improved display quality.

An embodiment provides a display device that may include a base layer, a circuit layer including a 1-1 pixel circuit and a 1-2 pixel circuit, the circuit layer being disposed on the base layer, and a light emitting element layer including a first light emitting element and a second light emitting element each including a first electrode, an emission layer, a second electrode, and a pixel defining film including a pixel opening exposing a portion of the first electrode. The light emitting element layer may be disposed on the circuit layer. The 1-1 pixel circuit and the 1-2 pixel circuit each may include a driving transistor including a source, a drain, an active, and a gate, and a gate conductive layer. An area in which the first electrode of the first light emitting element overlaps the gate conductive layer of the 1-1 pixel circuit in plan view may be equal to an area in which the first electrode of the second light emitting element overlaps the gate conductive layer of the 1-2 pixel circuit in plan view.

In an embodiment, the first electrode of the second light emitting element and the gate conductive layer may define a first electrode and a second electrode of a first capacitor, respectively, and the first electrode of the second light emitting element and the gate conductive layer may define a first electrode and a second electrode of a second capacitor, respectively.

In an embodiment, a capacitance of the first capacitor may be substantially equal to a capacitance of the second capacitor.

In an embodiment, in plan view, the pixel opening of the first light emitting element may overlap a lower side of the 1-1 pixel circuit. In plan view, the pixel opening of the second light emitting element may overlap an upper side of the 1-2 pixel circuit.

In an embodiment, the driving transistor may include an oxide semiconductor.

In an embodiment, the 1-1 pixel circuit may be disposed on the 1-2 pixel circuit in a first direction. The circuit layer may further include a 1-3 pixel circuit adjacent to the 1-1 pixel circuit in a second direction intersecting the first direction, and a 1-4 pixel circuit adjacent to the 1-2 pixel circuit in the second direction. The light emitting element layer may include a third light emitting element disposed on the 1-3 pixel circuit and a fourth light emitting element disposed on the 1-4 pixel circuit. The third light emitting element and the fourth light emitting element may each include a first electrode, an emission layer, a second electrode, and a pixel defining film including a pixel opening exposing a portion of the first electrode. The 1-3 pixel circuit and the 1-4 pixel circuit may each include a first portion, a second portion, and a third portion, which are divided in the first direction. In plan view, the first electrode of the third light emitting element may overlap the first to third portions of the 1-3 pixel circuit. In plan view, the first electrode of the fourth light emitting element may overlap the first to third portions of the 1-4 pixel circuit. In plan view, the pixel opening of the third light emitting element may overlap the second portion and the third portion of the 1-3 pixel circuit. In plan view, the pixel opening of the fourth light emitting element may overlap the first portion and the second portion of the 1-4 pixel circuit.

In an embodiment, the first light emitting element and the second light emitting element may emit first light.

In an embodiment, the first light emitting element may be electrically connected to the 1-1 pixel circuit, and the second light emitting element may be electrically connected to the 1-2 pixel circuit.

In an embodiment, the light emitting element layer may further include a fifth light emitting element emitting second light different from the first light and adjacent to the first light emitting element. The first light emitting element may be connected to the fifth light emitting element.

In an embodiment, a display device may include a base layer, a circuit layer including a 1-1 pixel circuit and a 1-2 pixel circuit adjacent to the 1-1 pixel circuit in a first direction, the circuit layer being disposed on the base layer, and a light emitting element layer including a first light emitting element disposed on the 1-1 pixel circuit and a second light emitting element disposed on the 1-2 pixel circuit, the light emitting element layer being disposed on the circuit layer. The first light emitting element and the second light emitting element may each include a first electrode, an emission layer, a second electrode, and a pixel defining film including a pixel opening exposing a portion of the first electrode. The 1-1 pixel circuit and the 1-2 pixel circuit each may include a first portion, a second portion, and a third portion, which are divided in the first direction. In plan view, the first electrode of the first light emitting element may overlap the first to third portions of the 1-1 pixel circuit. In plan view, the first electrode of the second light emitting element may overlap the first to third portions of the 1-2 pixel circuit. In plan view, the pixel opening of the first light emitting element may overlap the first portion and the second portion of the 1-1 pixel circuit. In plan view, the pixel opening of the second light emitting element may overlap the second portion and the third portion of the 1-2 pixel circuit.

In an embodiment, in plan view, the pixel opening of the first light emitting element may not overlap the third portion of the 1-1 pixel circuit. In plan view, the pixel opening of the second light emitting element may not overlap the first portion of the 1-2 pixel circuit.

In an embodiment, the 1-1 pixel circuit and the 1-2 pixel circuit may each include a driving transistor including a source, a drain, an active, and a gate, and a gate conductive layer. An area in which the first electrode of the first light emitting element overlaps the gate conductive layer of the 1-1 pixel circuit in plan view may be equal to an area in which the first electrode of the second light emitting element overlaps the gate conductive layer of the 1-2 pixel circuit in plan view.

In an embodiment, the driving transistor may be an oxide semiconductor.

In an embodiment, the 1-1 pixel circuit may be disposed on the 1-2 pixel circuit in the first direction. The circuit layer may further include a 1-3 pixel circuit adjacent to the 1-1 pixel circuit in a second direction intersecting the first direction, and a 1-4 pixel circuit adjacent to the 1-2 pixel circuit in the second direction. The light emitting element layer may include a third light emitting element disposed on the 1-3 pixel circuit and a fourth light emitting element disposed on the 1-4 pixel circuit. The third light emitting element and the fourth light emitting element each may include a first electrode, an emission layer, a second electrode, and a pixel defining film including a pixel opening exposing a portion of the first electrode. The 1-3 pixel circuit and the 1-4 pixel circuit may each include a first portion, a second portion, and a third portion, which are divided in the first direction. In plan view, the first electrode of the third light emitting element may overlap the first to third portions of the 1-3 pixel circuit. In plan view, the first electrode of the fourth light emitting element may overlap the first to third portions of the 1-4 pixel circuit. In plan view, the pixel opening of the third light emitting element may overlap the second portion and the third portion of the 1-3 pixel circuit. In plan view, the pixel opening of the fourth light emitting element may overlap the first portion and the second portion of the 1-4 pixel circuit.

In an embodiment, the first light emitting element and the second light emitting element may emit first light.

In an embodiment, the first light emitting element may be electrically connected to the 1-1 pixel circuit, and the second light emitting element may be electrically connected to the 1-2 pixel circuit.

In an embodiment, the light emitting element layer may further include a fifth light emitting element emitting second light different from the first light and adjacent to the first light emitting element. The first light emitting element may be connected to the fifth light emitting element.

In an embodiment, a display device may include a base layer, first to fourth pixel circuit units arranged in a direction, and first to fourth light emitting units arranged in the direction and disposed on the first to fourth pixel circuit units, respectively. The first to fourth light emitting units may each include a 1-1 light emitting element, a 1-2 light emitting element, a 1-3 light emitting element, and a 1-4 light emitting element. The 1-1 to 1-4 light emitting elements each may include a first electrode, an emission layer, a second electrode, and a pixel defining film including a pixel opening exposing a portion of the first electrode. The first to fourth pixel circuit units each may include a first pixel circuit electrically connected to the 1-1 light emitting element and the 1-2 light emitting element, and a second pixel circuit electrically connected to the 1-2 light emitting element, and a third pixel circuit electrically connected to the 1-3 light emitting element, the first to third pixel circuits each including a driving transistor including a source, a drain, an active, and a gate, and a gate conductive layer. Areas in which the first electrode of the 1-1 light emitting element and the first electrode of the 1-2 light emitting element overlap the gate conductive layer of the first pixel circuit in plan view may be equal in the first pixel circuit unit and the fourth pixel circuit unit.

In an embodiment, the pixel opening of the 1-1 light emitting element and the pixel opening of the 1-2 light emitting element may be disposed at different positions in the first pixel circuit unit and the fourth pixel circuit unit, respectively.

In an embodiment, the 1-1 light emitting element and the 1-2 light emitting element may emit first light. The 1-3 light emitting element may emit second light different from the first light. The 1-4 light emitting element may emit third light different from the first light and the second light.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
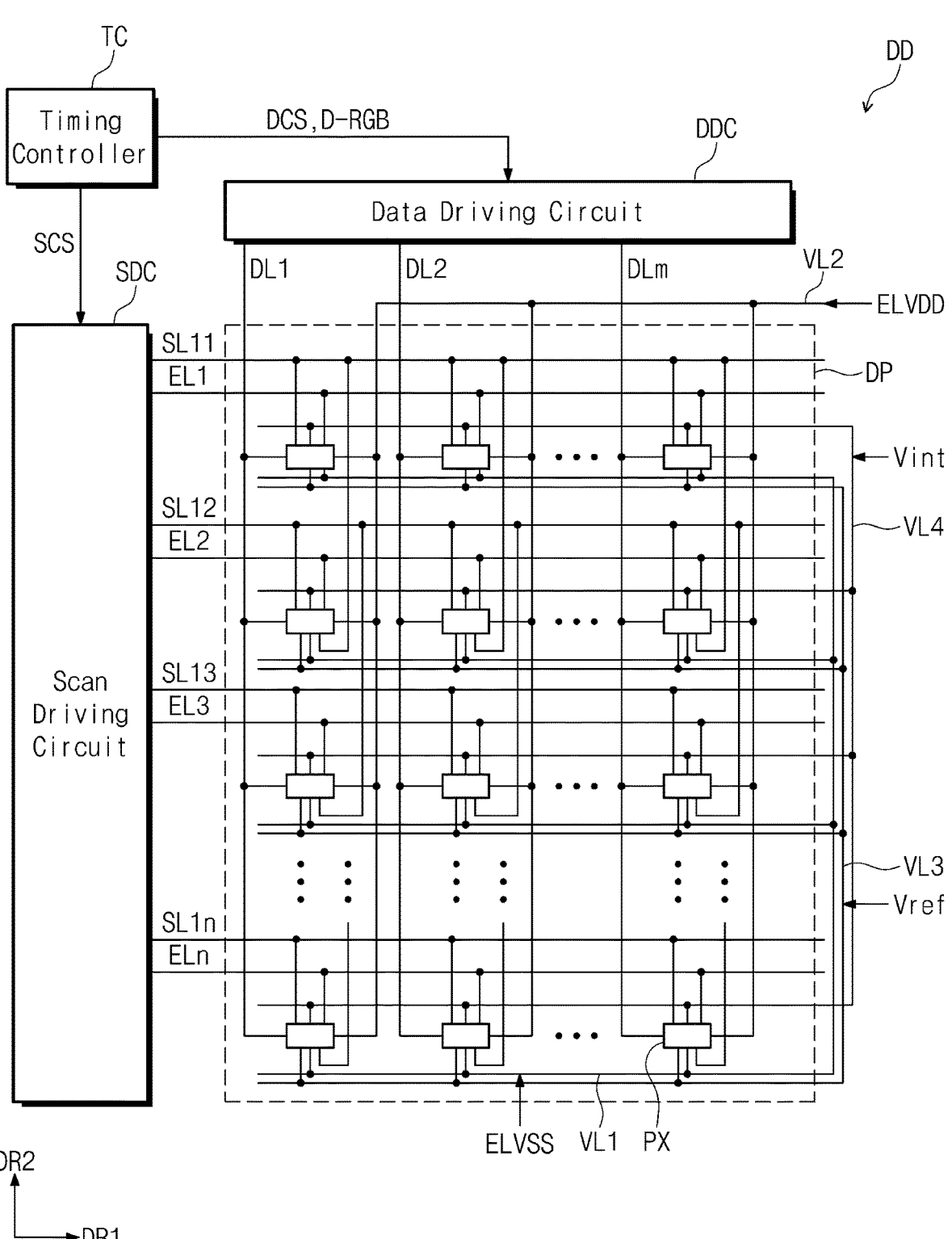
FIG. 1 is a schematic block diagram of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the description, when an element (or a region, a layer, a portion, etc.) is referred to as being "on," "connected to," or "coupled to" another element, it means that the element may be directly disposed on/connected to/coupled to another element, or that a third element may be disposed therebetween. Further, a connection may be physical and/or electrical in nature.

In the description, "directly disposed" may indicate that there is no layer, film, region, plate or the like added between a portion of a layer, a film, a region, a plate or the like and other portions. For example, "directly disposed" may indicate disposing without additional members such as an adhesive member between two layers or two members. Like reference numerals refer to like elements.

In the drawings, the thickness, the ratio, and the dimensions of elements may be exaggerated for an effective description of technical contents. In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the disclosure. The singular forms are intended to include the plural forms as well, unless the context clearly indicates otherwise.

Terms such as "below", "on a lower side", "above", "on a upper side", or the like may be used to describe the relationships of the components illustrated in the drawings. The terms are used as a relative concept and are described with reference to the direction indicated in the drawings. In the specification, being "disposed on" may represent not only being disposed on the top surface but also being disposed on the bottom surface.

It should be understood that the terms "comprise", "include", and "have" are intended to specify the presence of stated features, integers, steps, operations, elements, components, or combinations thereof in the disclosure, but do not preclude the presence or addition of one or more other features, integers, steps, operations, elements, components, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure belongs. Terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a schematic block diagram of a display device DD according to an embodiment of the disclosure. The display device DD may include a timing controller TC, a scan driving circuit SDC, a data driving circuit DDC, and a display panel DP. In an embodiment, the display panel DP is described as a light emitting display panel. The light emitting display panel may include an organic light emitting display panel or an inorganic light emitting display panel.

The timing controller TC may receive input image signals, convert data format of the input image signals to meet interface specifications with the scan driving circuit SDC, and generate image data D-RGB. The timing controller TC outputs image data D-RGB and various control signals DCS and SCS.

The scan driving circuit SDC may receive the scan control signal SCS from the timing controller TC. The scan control signal SCS may include a vertical start signal for initiating the operation of the scan driving circuit SDC, a clock signal for determining output timing of signals, and the like. The scan driving circuit SDC may generate scan signals and sequentially output the signals to corresponding scan signal lines SL11 to SL1$n$. The scan driving circuit SDC may generate light emitting control signals in response to the scan control signal SCS, and output the light emitting control signals to corresponding light emitting signal lines EL1 to ELn.

Although FIG. 1 shows that multiple scan signals and multiple light emitting control signals are output from one scan driving circuit SDC, embodiments of the disclosure are not limited thereto. In an embodiment of the disclosure, the display device DD may include multiple scan driving circuits. In an embodiment of the disclosure, a driving circuit generating and outputting multiple scan signals and a driving circuit generating and outputting multiple light emitting control signals may be separately formed.

The data driving circuit DDC may receive the data control signal DCS and the image data D-RGB from the timing controller TC. The data driving circuit DDC may convert the image data D-RGB into data signals, and output the data signals to multiple data lines DL1 to DLm which will be described later. The data signals may be analog voltages corresponding to the grayscale value of the image data D-RGB.

The display panel DP may include multiple groups of scan lines. FIG. 1 shows a first group of scan signal lines SL11 to SL1$n$ as an example. The display panel DP may include light emitting signal lines EL1 to ELn, data lines DL1 to DLm, a first voltage line VL1, a second voltage line VL2, a third voltage line VL3, and a fourth voltage line VL4, and pixels PX.

The first group of scan signal lines SL11 to SL1n may extend in a first direction DR1 and may be arranged in a second direction DR2. The data lines DL1 to DLm may cross (intersect) the first group of scan signal lines SL11 to SL1n.

The first voltage line VL1 may receive a first power voltage ELVSS. The second voltage line VL2 may receive a second power voltage ELVDD. The second power voltage ELVDD may have a lower level than the first power voltage ELVSS. The third voltage line VL3 may receive a reference voltage Vref (hereinafter, a first voltage). The fourth voltage line VL4 may receive an initialization voltage Vint (hereinafter, a second voltage). The first voltage Vref may have a lower level than the second power voltage ELVDD. The second voltage Vint may have a lower level than the second power voltage ELVDD. In an embodiment, the second voltage Vint may have a lower level than the first voltage Vref and the first power voltage ELVSS.

At least one of the first voltage line VL1, the second voltage line VL2, the third voltage line VL3, and the fourth voltage line VL4 may include at least one of a line extending in the first direction DR1 and a line extending in the second direction DR2. A voltage line extending in the first direction DR1 and a voltage line extending in the second direction DR2 may be electrically connected to each other even in case disposed on different layers among multiple insulating layers 10 to 40 shown in FIG. 4.

The display device DD according to an embodiment has been described with reference to FIG. 1 above, but the display device DD according to embodiments of the disclosure are not limited thereto. Signal lines may be further added or omitted depending on the configuration of a pixel driving circuit. A relationship of electrical connection between one pixel PX and the signal lines may change.

The pixels PX may include multiple groups generating different color light. For example, the pixels PX may include red pixels generating red color light, green pixels generating green color light, and blue pixels generating blue color light. A light emitting diode of the red pixel, a light emitting diode of the green pixel, and a light emitting diode of the blue pixel may include emission layers of different materials.

The pixel driving circuit may include transistors and at least one capacitor. At least one of the scan driving circuit SDC and the data driving circuit DDC may include multiple transistors formed through the same process as a pixel driving circuit.

The signal lines described above, the pixels PX, the scan driving circuit SDC, and the data driving circuit DDC may be formed on a base substrate through processes including a photolithography process and an etching process.

Multiple insulating layers may be formed on the base substrate through multiple instances of a deposition process and a coating process. The insulating layers may include organic layers and/or inorganic layers. Any one of the insulating layers may include multiple insulating patterns. The insulating layers may each overlap the pixels PX. Contact holes may be formed in the insulating layers. The contact holes may be arranged according to a predetermined or selectable rule for each of the pixels PX.

Figure 2:
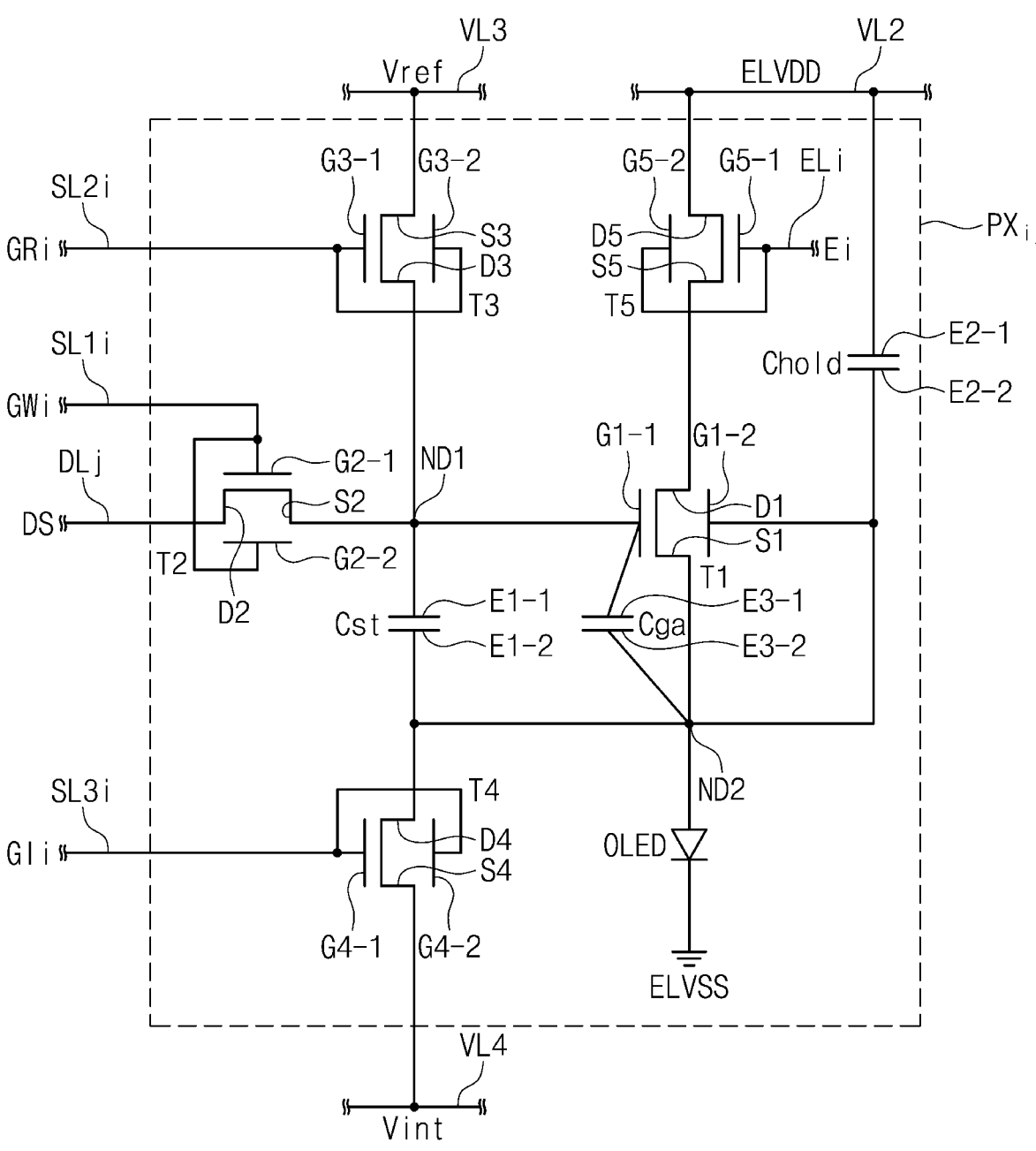
FIG. 2 is an equivalent circuit diagram of a pixel according to an embodiment of the disclosure.
Figure 3:
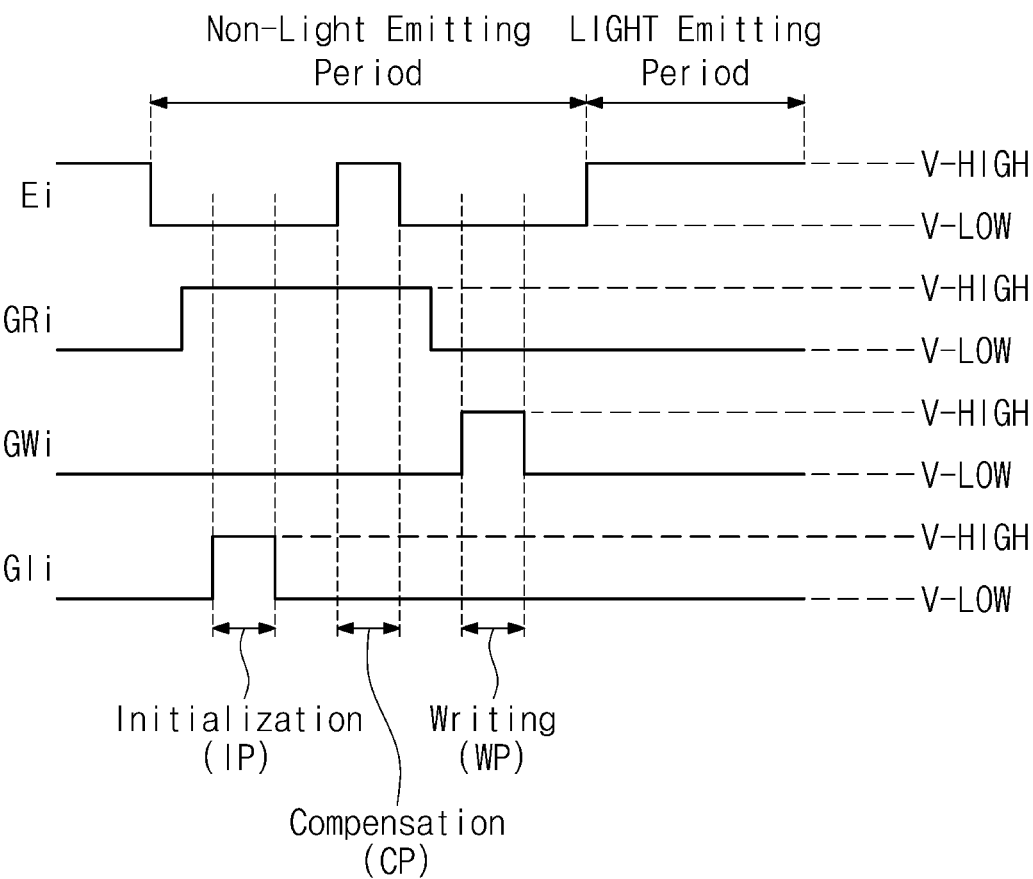
FIG. 3 is a schematic waveform diagram of driving signals for driving the pixel shown in FIG. 2.

FIG. 2 is an equivalent circuit diagram of a pixel PX_{ij} according to an embodiment of the disclosure. FIG. 3 is a schematic waveform diagram of driving signals for driving the pixel PX_{ij} shown in FIG. 2.

FIG. 2 shows a pixel PX_{ij} connected to an i-th scan line SL1i among the first group of scan lines SL11 to SL1n (see FIG. 1) and connected to a j-th data line DLj among the data lines DL1 to DLm (see FIG. 1) as a typical example. The pixel PX_{ij} may be connected to an i-th scan line SL2i among a second group of scan lines and connected to an i-th scan line SL3i among a third group of scan lines.

In an embodiment, the pixel driving circuit may include first to fifth transistors T1 to T5, a storage capacitor Cst, a hold capacitor Chold, and a light emitting diode OLED. In an embodiment, the first to fifth transistors T1 to T5 are described as N-type transistors. However, embodiments of the disclosure are not limited thereto, and at least one of the first to fifth transistors T1 to T5 may be a P-type transistor. In an embodiment of the disclosure, at least one of the first to fifth transistors T1 to T5 may be omitted, or an additional transistor may be further included in the pixel PX_{ij}.

In an embodiment, the first to fifth transistors T1 to T5 are each shown to include two gates, but at least one transistor may include only one gate. Upper gates G2-1, G3-1, G4-1, and G5-1 and lower gates G2-2, G3-2, G4-2, G5-2 of each of the second to fifth transistors T2 to T5 are shown to be electrically connected to each other, but embodiments of the disclosure are not limited thereto. The lower gates G2-2, G3-2, G4-2, and G5-2 of each of the second to fifth transistors T2 to T5 may be floating electrodes.

In an embodiment, the first transistor T1 may be a driving transistor, and the second transistor T2 may be a switching transistor. A node to which a gate G1-1 of the first transistor T1 is connected may be defined as a first node ND1, and a node to which the source S1 of the first transistor T1 is connected may be defined as a second node ND2.

The light emitting diode OLED may include a first electrode electrically connected to the first node ND1, a second electrode receiving the first power voltage ELVSS, and an emission layer disposed between the first electrode and the second electrode. Detailed descriptions of the light emitting diode OLED will be described later.

The first transistor T1 may be electrically connected between the second voltage line VL2 receiving the second power voltage ELVDD and the second node ND2. The first transistor T1 may include a source S1 (hereinafter, a first source), a drain D1 (hereinafter, a first drain), a semiconductor region, and a gate G1-1 (hereinafter, an upper gate) electrically connected to the second node ND2. The first transistor T1 may further include a gate G1-2 (hereinafter, a lower gate) connected to the second node ND2.

The second transistor T2 may be electrically connected between the first data line DLj and the first node ND1. The second transistor T2 may include a source S2 connected to the first node ND1, a drain D2 connected to the first data line DLj, a semiconductor region, and a gate G2-1 (hereinafter, a second upper gate) connected to the i-th scan line SL1i of the first group. The second transistor T2 may further include a gate G2-2 electrically connected to the second upper gate G2-1. Third to fifth transistors T3 to T5, which will be described later, may include upper gates G3-1, G4-1, and G5-1, and lower gates G3-2, G4-2, and G5-2 corresponding to the second upper gate G2-1 and the second lower gate G2-2.

The third transistor T3 may be electrically connected between the first node ND1 and the third voltage line VL3 receiving the first voltage Vref. The third transistor T3 may include a drain D3 (hereinafter, a third drain) connected to the first node ND1, a source S3 (hereinafter, a third source) connected to the third voltage line VL3, a semiconductor region, and a third upper gate G3-1 connected to the i-th scan line SL2*i* of the second group.

The fourth transistor T4 may be electrically connected between the fourth voltage line VL4 receiving the second voltage Vint and the second node ND2. The second transistor T4 may include a drain D4 (hereinafter, a fourth drain) connected to the second node ND2, a source S4 (hereinafter, a fourth source) connected to the fourth voltage line VL4, a semiconductor region, and a fourth upper gate G4-1 connected to the i-th scan line SL3*i* of the third group.

The fifth transistor T5 may be electrically connected between the second voltage line VL2 and the first drain D1 or the first source S1. In an embodiment, the fifth transistor T5 may include a source S5 (hereinafter, a fifth source) connected to the second voltage line VL2, a drain D5 (hereinafter, a fifth drain) connected to the first drain D1, a semiconductor region, and a fifth upper gate G5-1 connected to the i-th light emitting signal line EL1.

The storage capacitor Cst may be electrically connected between the first node ND1 and the second node ND2. The storage capacitor Cst may include a first electrode E1-1 connected to the first node ND1 and a second electrode E1-2 connected to the second node ND2.

The hold capacitor Chold may be electrically connected between the second voltage line VL2 and the second node ND2. The hold capacitor Chold may include a first electrode E2-1 connected to the second voltage line VL2 and a second electrode E2-2 connected to the second node ND2.

A gap capacitor Cga, which may be a parasitic capacitor, may be formed between the upper gate G1-1 of the first transistor T1 and an anode electrode of the light emitting diode OLED. As for the gap capacitor Cga, the upper gate G1-1 of the first transistor T1 may be a first electrode E3-1, and the anode electrode of the light emitting diode OLED may be a second electrode E3-2. For example, the gap capacitor Cga may be electrically connected between the first node ND1 and the second node ND2. Accordingly, the gap capacitor Cga may be connected to the storage capacitor Cst in parallel, and a capacitance of the gap capacitor Cga may be added to a capacitance of the storage capacitor Cst.

An operation of the pixel PX*ij* will be described in more detail with reference to FIGS. 2 and 3. The display device DD (see FIG. 1) may display images for each frame period. Signal lines of each of the first group of scan lines, the second group of scan lines, the third group of scan lines, and the light emitting signal lines may be sequentially scanned during the frame period. FIG. 3 shows a portion of a frame period.

Referring to FIG. 3, signals Ei, GRi, GWi, and Gli may each have a high level V-HIGH during a partial period and a low level V-LOW during a partial period. The N-type first to fifth transistors T1 to T5 described above may be turned on in case that the corresponding control signals have a high level V-HIGH.

During an initialization period IP, the third transistor T3 and the fourth transistor T4 may be turned on. The first node ND1 may be initialized to the first voltage Vref. The second node ND2 may be initialized to the second voltage Vint. The storage capacitor Cst may be initialized to a difference value between the first voltage Vref and the second voltage Vint. The hold capacitor Chold may be initialized to a difference value between the second power voltage ELVDD and the second voltage Vint.

During a compensation period CP, the third transistor T3 and the fifth transistor T5 may be turned on. In the storage capacitor Cst, a voltage corresponding to a threshold voltage of the first transistor T1 may be compensated.

During a writing period WP, the second transistor T2 may be turned on. The second transistor T2 may output a voltage corresponding to the data signal DS. As a result, a voltage value corresponding to the data signal DS may be charged in the storage capacitor Cst. The data signal DS that is compensated for the threshold voltage of the first transistor T1 may be charged in the storage capacitor Cst. The threshold voltages of the driving transistors may be different for each of the pixels PX (see FIG. 1), and the pixel PX*ij* shown in FIGS. 2 and 3 may supply a current having a magnitude proportional to the data signal DS to the light emitting diode OLED regardless of deviation of the threshold voltages of the driving transistors.

Thereafter, during a light emitting period, the fifth transistor T5 may be turned on. The first transistor T1 may provide a current corresponding to the voltage value stored in the storage capacitor Cst to the light emitting diode OLED. The light emitting diode OLED may emit light with a luminance corresponding to the data signal DS.

In an embodiment of the disclosure, a value of the capacitance formed between the first node ND1 and the second node ND2, for example, the sum of the capacitance of the storage capacitor Cst and the capacitance of the gap capacitor Cga may be controlled to be equal for each pixel by controlling a value of the gap capacitor Cga generated for each pixel PX*ij* to be equal. Accordingly, the display device DD (see FIG. 1) including the pixels PX*ij* may have improved display quality.

Figure 4:
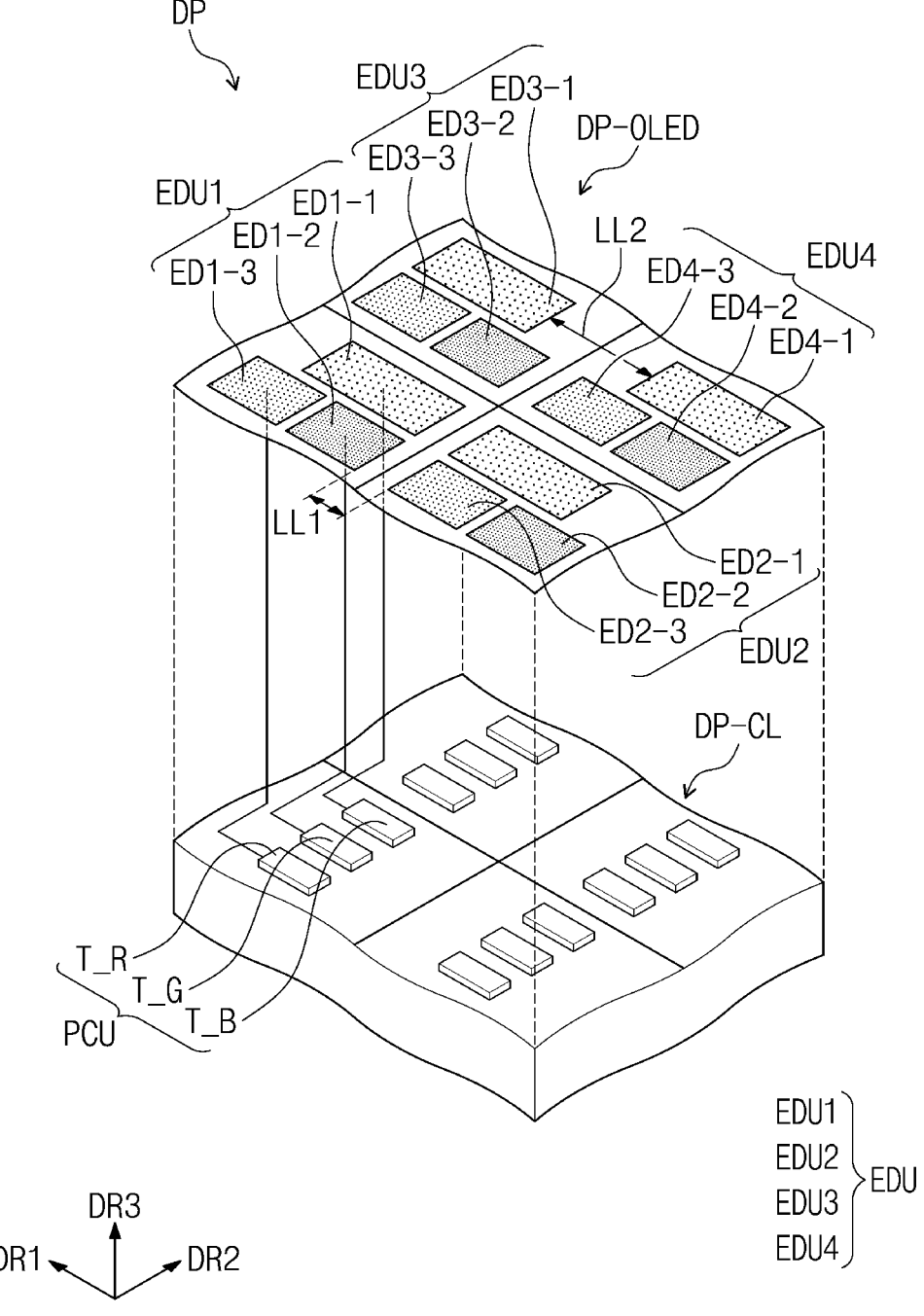
FIG. 4 is a view schematically showing a display panel according to an embodiment of the disclosure.

FIG. 4 is a view schematically showing a display panel DP according to an embodiment of the disclosure.

FIG. 4 shows a light emitting element layer DP-OLED and a circuit layer DP-CL included in the display panel DP.

The light emitting element layer DP-OLED may include light emitting element units EDU. In an embodiment, the light emitting element units EDU may include first to fourth light emitting element units EDU1, EDU2, EDU3, and EDU4, which are adjacent to each other. The light emitting element layer DP-OLED may include a structure in which the first to fourth light emitting element units EDU1, EDU2, EDU3, and EDU4 are repeatedly arranged on a plane.

In the first direction DR1, the second light emitting element unit EDU2 may be disposed below the first light emitting element unit EDU1, and the fourth light emitting element unit EDU4 may be disposed below the third light emitting element unit EDU3.

In the second direction DR2, the third light emitting element unit EDU3 may be disposed below the first light emitting element unit EDU1, and the fourth light emitting element unit EDU4 may be disposed below the second light emitting element unit EDU2.

The first to fourth light emitting element units EDU1, EDU2, EDU3, and EDU4 may each include first light-light emitting elements ED1-1, ED2-1, ED3-1, and ED4-1 that emit first light, second light-light emitting elements ED1-2, ED2-2, ED3-2, ED4-2 that emit second light different from the first light, and third light-light emitting elements ED1-3, ED2-3, ED3-3, and ED4-3 that emit third light different from the first light and the second light. FIG. 4 shows the first to third light-light emitting elements ED1-1, ED2-1, ED3-1, ED4-1, ED1-2, ED2-2, ED3-2, ED4-2, ED1-3, ED2-3, ED3-3, and ED4-3 with respect to a light emitting area.

In the first light emitting element unit EDU1 according to an embodiment, the first light-light emitting element ED1-1 may be in the form extending in the first direction DR1, and in the second direction DR2, the second light- and third light-light emitting elements ED1-2 and ED1-3 may be disposed at a side of the first light-light emitting element ED1-1. The same descriptions may be applied to the second to fourth light emitting element units EDU2, EDU3, and EDU4.

In the first direction DR1, the first light-light emitting element ED1-1 of the first light emitting element unit EDU1 may face the first light-light emitting element ED2-1 of the second light emitting element unit EDU2, and the first light-light emitting element ED3-1 of the third light emitting element unit EDU3 may face the first light-light emitting element ED4-1 of the fourth light emitting element unit EDU4.

A distance LL1 between the first light-light emitting element ED1-1 of the first light emitting element unit EDU1 and the first light-light emitting element ED2-1 of the second light emitting element unit EDU2 may be less than a distance LL2 between the first light-light emitting element ED3-1 of the third light emitting element unit EDU3 and the first light-light emitting element ED4-1 of the fourth light emitting element unit EDU4. The display panel DP according to an embodiment of the disclosure may include the structure as described above to have greater viewability than a case where the first light-light emitting elements ED1-1, ED2-1, ED3-1, and ED4-1 are disposed at the same position for each of the first to fourth light emitting element units EDU1, EDU2, EDU3, and EDU4.

The second light-light emitting elements ED1-2, ED2-2, ED3-2, and ED4-2, and the third light-light emitting elements ED1-3, ED2-3, ED3-3, and ED4-3 may each be disposed at the same position for each of the first to fourth light emitting element units EDU1, EDU2, EDU3, and EDU4. However, embodiments of the disclosure are not limited thereto.

The circuit layer DP-CL may be disposed below the light emitting element layer DP-OLED. The circuit layer DP-CL may include multiple pixel circuit units PCU. The pixel circuit units PCU may be connected to a corresponding one among the light emitting element units EDU to drive the connected light emitting element units EDU. FIG. 4 shows first to third pixel transistors T_B, T_G, and T_R as components of the pixel circuit unit PCU. The first to third pixel transistors T_B, T_G, and T_R may be electrically connected to the first light- to third light-light emitting elements ED1-1, ED1-2, and ED1-3, respectively. The first to third pixel transistors T_B, T_G, and T_R may each be a driving transistor. For example, in an embodiment, the first to third pixel transistors T_B, T_G, and T_R may each correspond to the first transistor T1 described above with reference to FIG. 1.

The first pixel transistor T_B and the first light-light emitting element ED1-1 connected thereto may constitute a pixel. The second pixel transistor T_G and the second light-light emitting element ED1-2 connected thereto may constitute a pixel. The third pixel transistor T_R and the third light-light emitting element ED1-3 connected thereto may constitute a pixel. However, embodiments of the disclosure are not limited thereto, and the first light emitting element unit EDU1 and a pixel circuit unit PCU connected thereto may be defined as a pixel.

Figure 5:
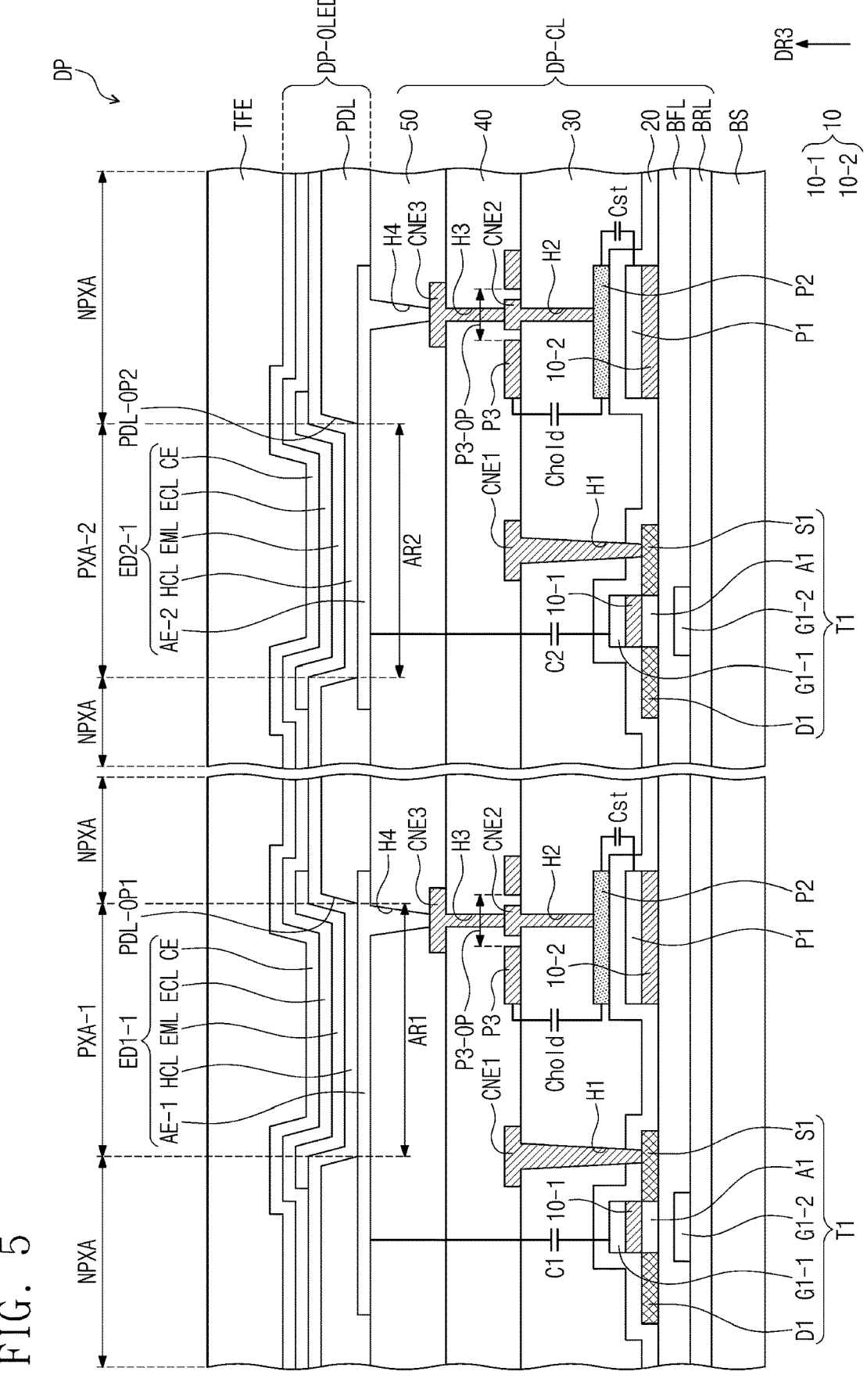
FIG. 5 is a schematic cross-sectional view of a display panel according to an embodiment of the disclosure.

FIG. 5 is a schematic cross-sectional view of a display panel DP according to an embodiment of the disclosure. FIG. 5 is a partial cross-sectional view of a display panel DP including the first light-light emitting element ED1-1 (hereinafter, a first light emitting element) of the first light emitting element unit EDU1 and the first light-light emitting element ED2-1 (hereinafter, a second light emitting element) of the second light emitting element unit EDU2 described above in FIG. 4.

Two first transistors T1 may be disposed below the first light emitting element ED1-1 and the second light emitting element ED2-1. The first light emitting element ED1-1 and the second light emitting element ED2-1 may each be disposed to overlap the first transistors T1 in plan view.

In an embodiment, the two first transistors T1 may be electrically connected to the first light emitting element ED1-1 and the second light emitting element ED2-1. The two first transistors T1 may each be the first pixel transistor T_B described with reference to FIG. 4. For example, in different portions of the display panel DP, the sources S1 of the two first transistors T1 may be electrically connected to an anode electrodes AE (or the first electrode) of the first light emitting element ED1-1 and the second light emitting element ED2-1.

However, embodiments of the disclosure are not limited thereto. For example, at least one of the two first transistors T1 may not be connected to the first light emitting element ED1-1 or the second light emitting element ED2-1, but may be connected to the second light-light emitting elements ED1-2 and ED2-2 or the third light-light emitting elements ED1-3 and ED2-3. For example, the first light emitting element ED1-1 may overlap the second pixel transistor T_G connected to the second light-light emitting element ED1-2 disposed adjacent to the first light emitting element ED1-1 in FIG. 4 in plan view. In another embodiment, the first light emitting element ED1-1 may overlap the third pixel transistor T_R connected to the third light-light emitting element ED1-3 disposed adjacent to the first light emitting element ED1-1 in FIG. 4 in plan view.

As described above, the first transistor T1 shown in FIG. 5 is not necessarily electrically connected to the first light emitting element ED1-1 or the second light emitting element ED2-1, and the following description may be applied in case that a first transistor T1 overlaps a light emitting element ED1-1.

Referring to FIG. 5, the display panel DP may include a base layer BS, a circuit layer DP-CL disposed on the base layer BS, a light emitting element layer DP-OLED, and a thin film encapsulation layer TFE. The display panel DP may further include functional layers such as an anti-reflection layer or a refractive index control layer. The circuit layer DP-CL may include at least insulating layers, a semiconductor pattern, a conductive pattern, and a signal line. Hereinafter, the insulating layers may include an organic layer and/or an inorganic layer.

The base layer BS may be a synthetic resin layer including a synthetic resin. The synthetic resin layer may include a thermosetting resin. In particular, the synthetic resin layer may be a polyimide-based resin layer, and the material is not particularly limited. The synthetic resin layer may include at least one of an acrylic-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BS may include a glass substrate, a metal substrate, and/or an organic/inorganic composite material substrate.

At least one inorganic layer may be formed on an upper surface of the base layer BS. The inorganic layer may include at least one of aluminum oxide, titanium oxide, silicon oxide, silicon nitride, silicon oxynitride, zirconium oxide, and hafnium oxide. The inorganic layer may be formed as multiple layers. The multi-layered inorganic layers may constitute a barrier layer BRL and/or a buffer layer BFL, which will be described later. The barrier layer BRL and the buffer layer BFL may be selectively disposed.

The barrier layer BRL may prevent foreign substances from being introduced from the outside. The buffer layer BRL may include a silicon oxide layer and a silicon nitride layer. Multiple ones of these layers may be provided, and silicon oxide layers and silicon nitride layers may be alternately stacked on each other.

A conductive layer (hereinafter, a first conductive layer) may be disposed on the barrier layer BRL. The first conductive layer may include multiple conductive patterns. FIG. 5 shows a partial pattern of the first conductive layer. The lower gate G1-2 is shown as an example of the conductive pattern of the first conductive layer.

The buffer layer BFL may be disposed on the barrier layer BRL to cover the lower gate G1-2. The buffer layer BFL may increase the bonding force between the base layer BS and semiconductor patterns and/or conductive patterns. The buffer layer BFL may include a silicon oxide layer and a silicon nitride layer. The silicon oxide layer and the silicon nitride layer may be alternately stacked on each other.

A semiconductor layer may be disposed on the buffer layer BFL. The semiconductor layer may include multiple semiconductor patterns. The semiconductor patterns may include a metal oxide. The metal oxide semiconductor may include a crystalline or amorphous oxide semiconductor. For example, the oxide semiconductor may include a metal oxide including zinc (Zn), indium (In), gallium (Ga), tin (Sn), titanium (Ti), or a mixture of metals such as zinc (Zn), indium (In), gallium (Ga), tin (Sn), and titanium (Ti) and an oxide thereof. The oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), and/or zinc-tin oxide (ZTO).

The semiconductor patterns may include multiple regions divided according to whether metal oxides are reduced. A region in which the metal oxides are reduced (hereinafter, reduction region) may have greater conductivity than a region in which the metal oxides are not reduced (hereinafter, non-reduction region). The reduction region may substantially serve as a source/drain of transistors or signal lines. The non-reduction region may substantially correspond to a semiconductor region (or a channel) of transistors. For example, a portion of the semiconductor patterns may be a semiconductor region of transistors, another portion may be a source/drain of transistors, and another portion may be a signal transmission region.

The source S1, the semiconductor region A1, and the drain D1 of the first transistor T1 may be formed from the semiconductor patterns. The source S1 and the drain D1 of the first transistor T1 may extend in opposite directions from the semiconductor region A1.

The lower gate G1-2 described above may have a function of a light blocking pattern. The lower gate G1-2 may be disposed below the semiconductor region A1 of the first transistor T1 to block light incident on the first transistor T1 from the outside. The light blocking pattern may prevent external light from changing voltage-current properties of the first transistor T1.

A first insulating layer 10 may be disposed on the buffer layer BFL. In an embodiment, the first insulating layer 10 may not be formed entirely on the display panel DP, but may be only a specific conductive pattern, which will be described later. The first insulating layer 10 may include multiple insulating patterns. FIG. 4 shows a first insulating pattern 10-1 and a second insulating pattern 10-2 as an example.

The first insulating pattern 10-1 may overlap the lower gate G1-2 and the upper gate G1-1, which will be described later. The second insulating pattern 10-2 may overlap a first conductive pattern P1 (or a gate conductive layer), which will be described later.

A conductive layer (hereinafter, a second conductive layer) may be disposed on the first insulating layer 10. The second conductive layer may include multiple conductive patterns each overlapping the insulating patterns 10-1 and 10-2 of the first insulating layer 10. FIG. 5 shows the upper gate G1-1 and the first conductive pattern P1 as an example of the conductive pattern of the second conductive layer. The second conductive layer and the first insulating layer may be etched through the same process, and thus the conductive pattern of the second conductive layer and the insulating pattern of the first insulating layer may have substantially the same shape.

The first conductive pattern P1 may define the first electrode E1-1 of the storage capacitor Cst shown in FIG. 2. In a cross-sectional view, the first conductive pattern P1 is shown to be spaced apart from the upper gate G1-1 of the first transistor T1, but the first conductive pattern P1 may have a single-body shape with the upper gate G1-1 of the first transistor T1. For example, a first portion of any one conductive pattern may correspond to the upper gate G1-1 of the first transistor T1, and a second portion may correspond to the first conductive pattern P1.

A second insulating layer 20 covering the upper gate G1-1 and the first conductive pattern P1 may be disposed on the buffer layer BFL. The second insulating layer 20 may be an inorganic layer and/or an organic layer, and may have a single-layered or multi-layered structure.

A conductive layer (hereinafter, a third conductive layer) may be disposed on the second insulating layer 20. The third conductive layer may include multiple conductive patterns. FIG. 5 shows the second conductive pattern P2 as an example of the conductive pattern of the third conductive layer.

A second conductive pattern P2 overlapping the first conductive pattern P1 may be disposed on the second insulating layer 20. The second conductive pattern P2 may define the second electrode E1-2 of the storage capacitor Cst and the second electrode E2-2 of the hold capacitor Chold shown in FIG. 2.

A third insulating layer 30 covering the second conductive pattern P2 may be disposed on the second insulating layer 20. In an embodiment, the third insulating layer 30 may be an organic layer and may have a single-layered structure, but is not particularly limited.

A conductive layer (hereinafter, a fourth conductive layer) may be disposed on the third insulating layer 30. The fourth conductive layer may include multiple conductive patterns. The fourth conductive layer includes a third conductive pattern P3 defining the first electrode E2-1 of the hold capacitor Chold shown in FIG. 2. An opening P3-OP may be defined in the third conductive pattern P3.

The fourth conductive layer may further include multiple connection electrodes. FIG. 4 shows first and second connection electrodes CNE1 and CNE2 as an example. The first connection electrode CNE1 may be connected to the first source S1 through a contact hole H1 passing through the second and third insulating layers 20 and 30, and the second connection electrode CNE2 may be connected to the second conductive pattern P2 through a contact hole H2 passing through the third insulating layer 30.

A fourth insulating layer 40 covering the third conductive layer may be disposed on the third insulating layer 30. In an embodiment, the fourth insulating layer 40 may be an organic layer and may have a single-layered structure, but is not particularly limited.

A conductive layer (hereinafter, a fifth conductive layer) may be disposed on the fourth insulating layer 40. The fifth conductive layer may include multiple conductive patterns. The fifth conductive layer may include a third connection electrode CNE3. The third connection electrode CNE3 may be connected to the second connection electrode CNE2 through a contact hole H3 passing through the fourth insulating layer 40.

A fifth insulating layer 50 covering the fourth conductive layer may be disposed on the fourth insulating layer 40. In an embodiment, the fifth insulating layer 50 may be an organic layer and may have a single-layered structure, but is not particularly limited.

Anode electrodes AE-1 and AE-2 of the light emitting diode OLED may be disposed on the fifth insulating layer 50. A pixel defining film PDL may be disposed on the fifth insulating layer 50. The anode electrodes AE-1 and AE-2 may be connected to the third connection electrode CNE3 through a contact hole H4 passing through the fifth insulating layer 50.

In an embodiment, the first light emitting element ED1-1 and the second light emitting element ED2-1 may each include anode electrodes AE-1 and AE-2, a hole control layer HCL, an emission layer EML, an electron control layer ECL, and a cathode electrode CE (or a second electrode).

The pixel defining film PDL may expose at least a portion of the anode electrodes AE-1 and AE-2 to define light emitting regions PXA-1 and PXA-2. A non-light emitting region NPXA may surround the light emitting regions PXA-1 and PXA-2 in plan view.

For example, a first pixel opening PDL-OP1 of the pixel defining film PDL may expose a first region AR1 of the anode electrode AE-1 of the first light emitting element ED1-1 to define the light emitting region PXA-1. A second pixel opening PDL-OP2 of the pixel defining film PDL may expose a second region AR2 of the anode electrode AE-2 of the second light emitting element ED2-1 to define the light emitting region PXA-2. Areas of the anode electrode AE-1 of the first light emitting element ED1-1 and the anode electrode AE-2 of the second light emitting element ED2-1 may be equal, and in one anode electrode AE-1 and AE-2, the first region AR1 and the second region AR2 may be different regions. For example, the first region AR1 may not overlap the upper gate G1-1 of the first transistor T1 in plan view, and the second region AR2 may overlap the upper gate G1-1 of the first transistor T1 in plan view.

The anode electrodes AE-1 and AE-2 of the light emitting elements ED1-1 and ED1-2 may form the upper gate G1-1 of the first transistor T1 and the gap capacitor Cga disposed thereunder. To be specific, the anode electrode AE-1 of the first light emitting element ED1-1 may form the upper gate G1-1 and the first gap capacitor C1 of the first transistor T1, and the anode electrode AE-2 of the second light emitting element ED2-1 may form the upper gate G1-1 of the first transistor T1 and the second gap capacitor C2. The first gap capacitor C1 and the second gap capacitor C2 may each correspond to the gap capacitor Cga described above with reference to FIG. 2.

In an embodiment of the disclosure, the overlapping area of the anode electrode AE-1 and the upper gate G1-1 of the first light emitting element ED1-1 may be equal to the overlapping area of the anode electrode AE-2 and the upper gate G1-1 of the second light emitting element ED2-1. Accordingly, a size of the first gap capacitor C1 may be substantially equal to a size of the second gap capacitor C2, and a deviation of the gap capacitors C1 and C2 between the adjacent light emitting elements ED1-1 and ED2-1 may be substantially zero.

The hole control layer HCL may be disposed on the anode electrodes AE-1 and AE-2. The hole control layer HCL may be commonly disposed in the light emitting region PXA and the non-light emitting region NPXA. In an embodiment, the hole control layer HCL may include a hole transport layer and a hole injection layer.

An emission layer EML may be disposed on the hole control layer HCL. The emission layer EML may be disposed in a region corresponding to the pixel openings PDL-OP1 and PDL-OP2. The emission layer EML may be separately formed in each of the light emitting elements ED1-1 and ED1-2. In an embodiment, the patterned emission layer EML is shown as an example, but the emission layer EML may be commonly disposed in the light emitting elements ED1-1 and ED1-2. The commonly disposed emission layer EML may generate white light or blue light. The emission layer EML may have a multi-layered structure.

The electron control layer ECL is disposed on the emission layer EML. In an embodiment, the electron control layer ECL may include an electron transport layer and an electron injection layer. A cathode electrode CE is disposed on the electron control layer ECL. The electron control layer ECL and the cathode electrode CE are commonly disposed in the light emitting elements ED1-1 and ED1-2.

The thin film encapsulation layer TFE may be disposed on the cathode electrode CE. The thin film encapsulation layer TFE may be commonly disposed on the light emitting elements ED1-1 and ED1-2. In an embodiment, the thin film encapsulation layer TFE may directly cover the cathode electrode CE. In an embodiment of the disclosure, a capping layer directly covering the cathode electrode CE may be further disposed. The thin film encapsulation layer TFE may include at least an inorganic layer or an organic layer. In an embodiment of the disclosure, the thin film encapsulation layer TFE may include two inorganic layers and an organic layer disposed therebetween. In an embodiment of the disclosure, the thin film encapsulation layer may include multiple inorganic layers and multiple organic layers, which are alternately stacked on each other.

Figure 6:
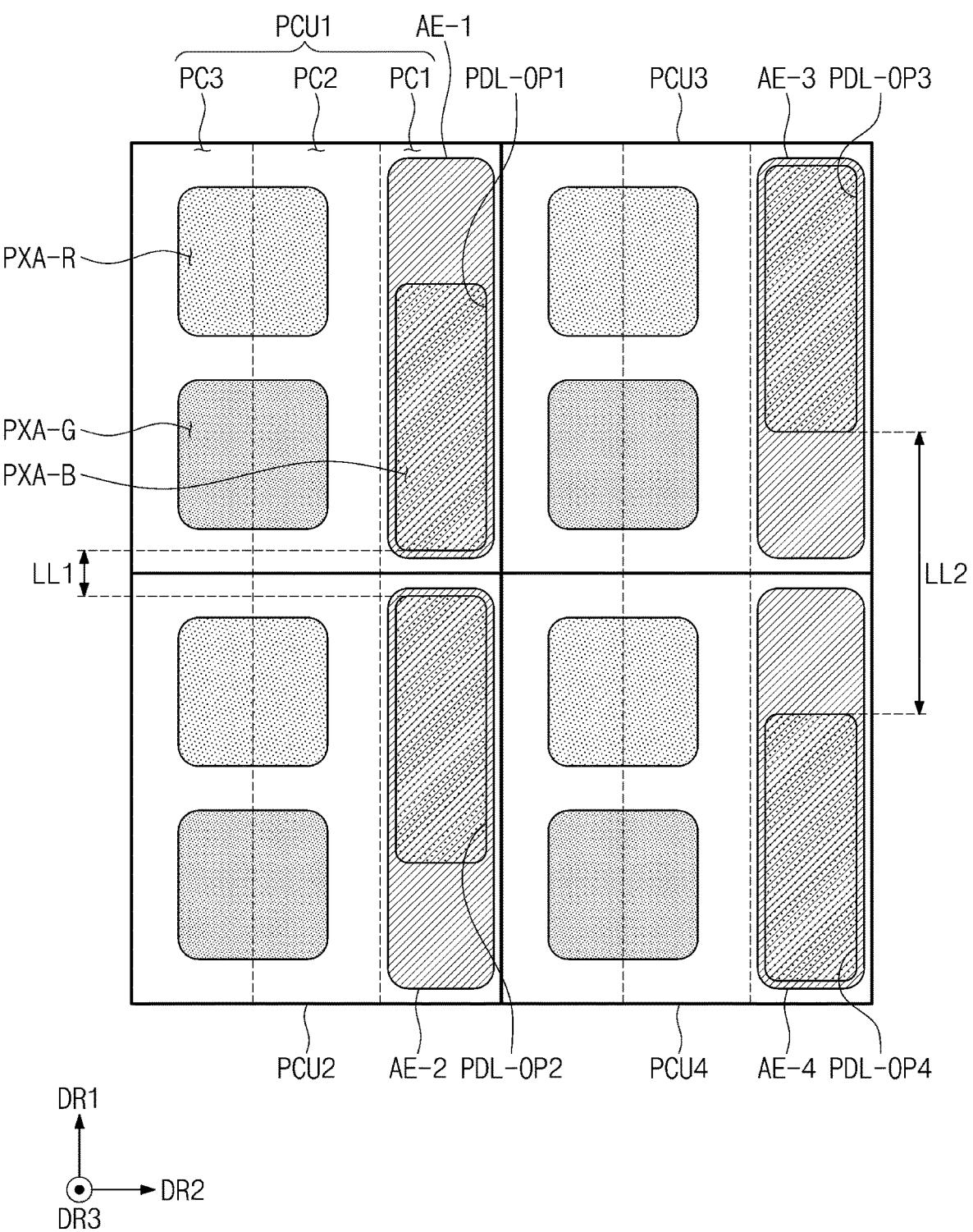
FIG. 6 is a schematic plan view of a display panel according to an embodiment of the disclosure.

FIG. 6 is a schematic plan view of a display device DP according to an embodiment of the disclosure.

FIG. 6 shows components of the display panel DP in FIG. 4. FIG. 6 shows first to fourth pixel circuit units PCU1, PCU2, PCU3, and PCU4 and first to fourth anode electrodes AE-1, AE-2, AE-3 and AE-4.

The first to fourth pixel circuit units PCU1, PCU2, PCU3, and PCU4 may be electrically connected to the four light emitting element units EDU1, EDU2, EDU3, and EDU4 described above with reference to FIG. 4, respectively.

The first to fourth pixel circuit units PCU1, PCU2, PCU3, and PCU4 may each include a first pixel circuit PC1, a second pixel circuit PC2, and a third pixel circuit PC3. The first pixel circuit PC1, the second pixel circuit PC2, and the third pixel circuit PC3 may be circuits for driving each of the first light- to third light-light emitting elements ED1-1, ED1-2, and ED1-3 described above with reference to FIG. 4. For example, the first pixel circuit PC1, the second pixel circuit PC2, and the third pixel circuit PC3 may each include the first to third pixel transistors T_B, T_G, and T_R described above in FIG. 4. The first pixel circuit PC1 included in the first pixel circuit unit PCU1 may be a 1-1 pixel circuit. The first pixel circuit PC1 included in the second pixel circuit unit PCU2 may be a 1-2 pixel circuit. The first pixel circuit PC1 included in the third pixel circuit unit PCU3 may be a 1-3 pixel circuit. The first pixel circuit PC1 included in the fourth pixel circuit unit PCU4 may be a 1-4 pixel circuit.

The first to fourth anode electrodes AE-1, AE-2, AE-3, and AE-4 may be included in each of the first light-light emitting elements ED1-1, ED2-1, ED3-1, and ED4-1 (see FIG. 4) described above with reference to FIG. 4. FIG. 6 shows first to third light emitting regions PXA-B, PXA-G, and PXA-R instead of the first to third light-light emitting elements ED1-1, ED1-2, and ED1-3. In an embodiment, the first light emitting region PXA-B may emit blue light, the second light emitting region PXA-G may emit green light, and the third light emitting region PXA-R may emit red light. However, embodiments of the disclosure are not limited thereto.

The first to third light emitting regions PXA-B, PXA-G, and PXA-R may be defined by a pixel opening. For example, the first light emitting regions PXA-B may be defined to correspond to shapes of the first to fourth pixel openings PDL-OP1, PDL-OP2, PDL-OP3, and PDL-OP4. The first to fourth pixel openings PDL-OP1, PDL-OP2, PDL-OP3, and PDL-OP4 may expose at least a portion of each of the first to fourth anode electrodes AE-1, AE-2, AE-3, and AE-4.

As for the first anode electrode AE-1, the descriptions of the anode electrode AE-1 of the first light emitting element ED1-1 in FIG. 5 may be equally applied. As for the second anode electrode AE-2, the descriptions of the anode electrode AE-2 of the second light emitting element ED2-1 in FIG. 5 may be equally applied. As for the first and second pixel openings PDL-OP1 and PDL-OP2, the descriptions of the first and second pixel openings PDL-OP1 and PDL-OP2 in FIG. 5 may be equally applied.

As for the third anode electrode AE-3 and the third pixel opening PDL-OP3 in the third pixel circuit unit PCU3, the descriptions of the second anode electrode AE-2 and the second pixel opening PDL-OP2 in the second pixel circuit unit PCU2 may be equally applied. As for the fourth anode electrode AE-4 and the fourth pixel opening PDL-OP4 in the fourth pixel circuit unit PCU4, the descriptions of the first anode electrode AE-1 and the first pixel opening PDL-OP1 in the first pixel circuit unit PCU1 may be equally applied.

As described above with reference to FIG. 4, a pixel may include a light emitting element and a pixel circuit connected to the light emitting element. For example, the first pixel may include a first light emitting element ED1-1 (see FIG. 5) including a first anode electrode AE-1 and a first pixel circuit PC1 connected to the first light emitting element ED1-1 (see FIG. 5). The second pixel may include a second light emitting element ED2-1 (see FIG. 5) including a second anode electrode AE-2 and a first pixel circuit PC1 connected to the second light emitting element ED2-1 (see FIG. 5). The third pixel may include a second light emitting element ED2-1 (see FIG. 5) including a third anode electrode AE-3 and a first pixel circuit PC1 connected to the second light emitting element ED2-1 (see FIG. 5).

In the first to fourth pixels, positions and areas of the first to fourth anode electrodes AE-1, AE-2, AE-3, and AE-4 may be equal. Accordingly, in the first to fourth pixels, the overlapping areas of the first to fourth anode electrodes AE-1, AE-2, AE-3, and AE-4 and the first pixel circuit PC1 may be equal to each other.

In comparison, areas of the first to fourth pixel openings PDL-OP1, PDL-OP2, PDL-OP3, and PDL-OP4 may be equal, but positions of the first to fourth pixel openings PDL-OP1, PDL-OP2, PDL-OP3, and PDL-OP4 in the first to fourth pixels may be different from each other.

For example, in the first pixel, the first pixel opening PDL-OP1 may be adjacent to a lower end of the first pixel circuit PC1, in the second pixel, the second pixel opening PDL-OP2 may be adjacent to an upper end of the first pixel circuit PC1, in the third pixel, the third pixel opening PDL-OP3 may be adjacent to an upper end of the first pixel circuit PC1, and in the fourth pixel, the fourth pixel opening PDL-OP4 may be adjacent to a lower end of the first pixel circuit PC1. Accordingly, the distance LL1 between the first pixel opening PDL-OP1 and the second pixel opening PDL-OP2 may be less than the distance LL2 between the third pixel opening PDL-OP3 and the fourth pixel opening PDL-OP4.

Accordingly, an area in which specific components included in the first pixel circuit PC1 and the first pixel opening PDL-OP1 overlap in plan view may be different from an area in which specific components included in the first pixel circuit PC1 and the second pixel opening PDL-OP2 overlap in plan view. For example, see FIGS. 7 to 9B.

Figure 7:
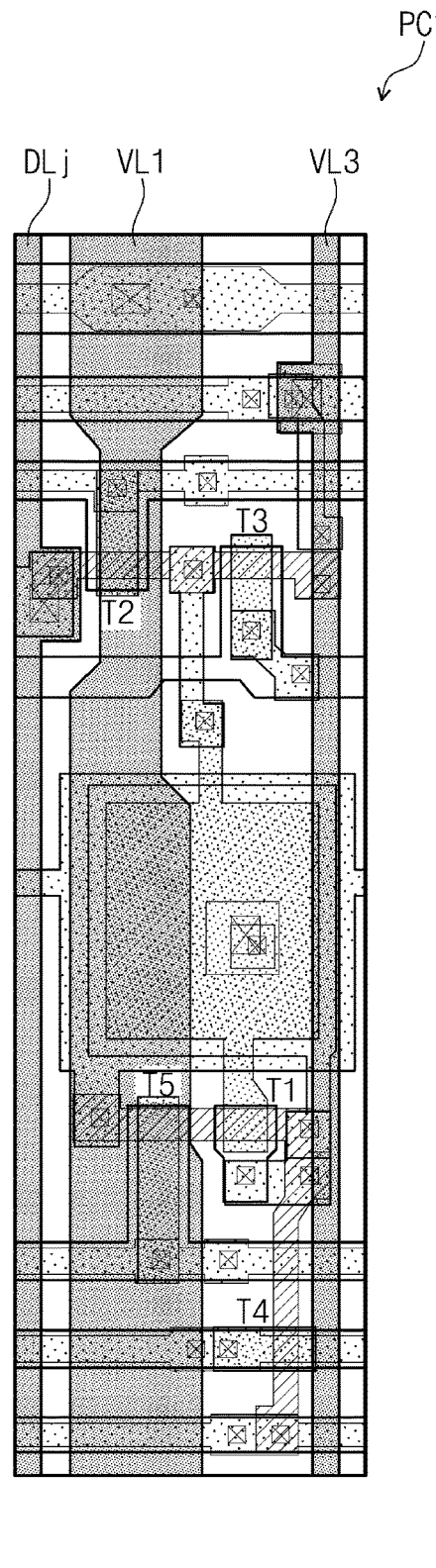
FIG. 7 is a schematic plan view of a pixel circuit according to an embodiment of the disclosure.
Figure 8:
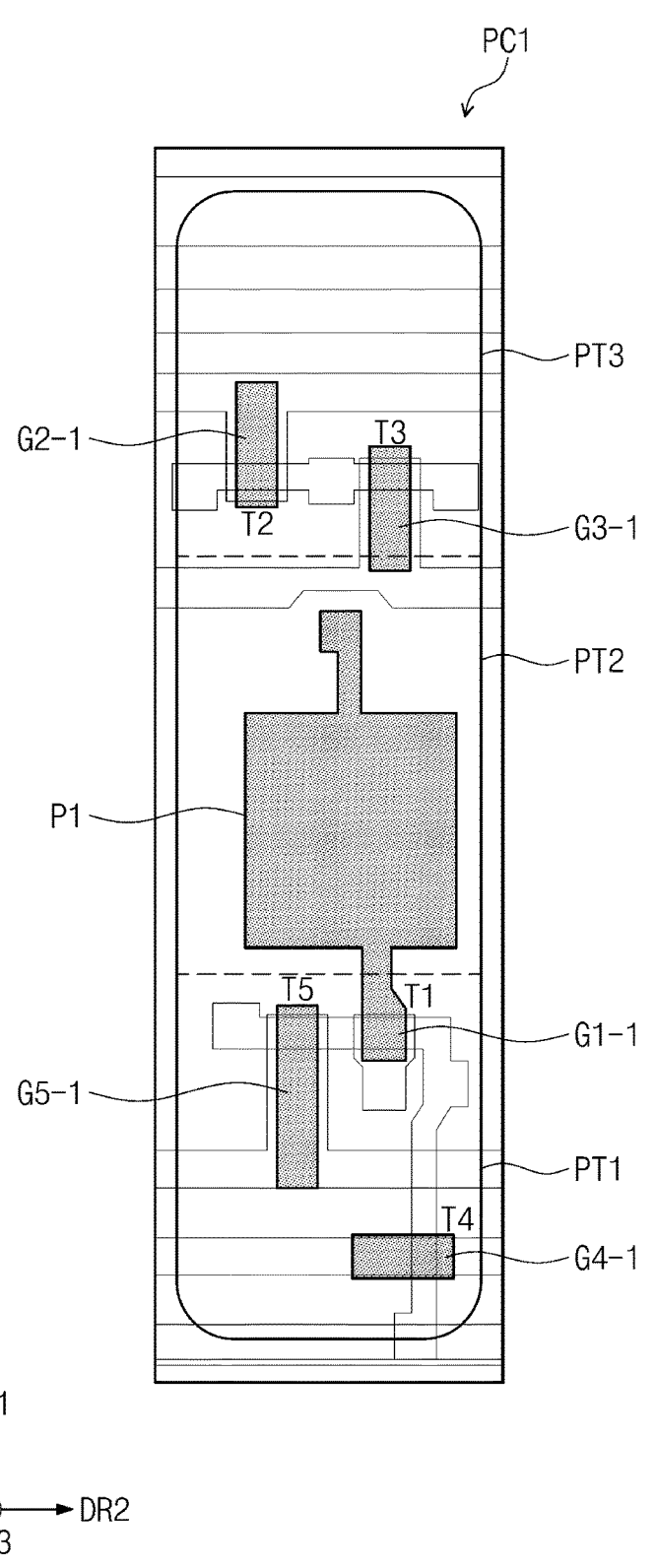
FIG. 8 is a schematic plan view showing a portion of patterns included in a pixel circuit according to an embodiment of the disclosure.

FIG. 7 is a schematic plan view of a pixel circuit PC1 according to an embodiment of the disclosure. FIG. 8 is a schematic plan view showing a portion of patterns included in a pixel circuit PC1 according to an embodiment of the disclosure. FIGS. 7 and 8 are plan views enlarging the first pixel circuit PC1 according to an embodiment included in the first to fourth pixel circuit units PCU1, PCU2, PCU3, and PCU4 shown in FIG. 6.

Referring to FIG. 7, the first pixel circuit PC1 according to an embodiment may include multiple conductive layers. For example, the first pixel circuit PC1 may include the first to fifth conductive layers described above with reference to FIG. 4. FIG. 7 shows, as an example, first to fifth transistors T1, T2, T3, T4, and T5, a data line DLj, a first voltage line VL1, and a third voltage line VL3.

FIG. 8 shows a second conductive layer among multiple conductive layers included in the first pixel circuit PC1 shown in FIG. 7. The second conductive layer may include multiple conductive patterns, and for example, the second conductive layer may include upper gates G1-1, G2-1, G3-1, G4-1, and G5-1 of the first, second, third, fourth, and fifth transistors T1 to T5, and a first conductive pattern P1. The first conductive pattern P1 may have a single-body shape with the upper gate G1-1 of the first transistor T1.

The first pixel circuit PC1 according to an embodiment may include a first portion PT1, a second portion PT2, and a third portion PT3.

Figure 9A:
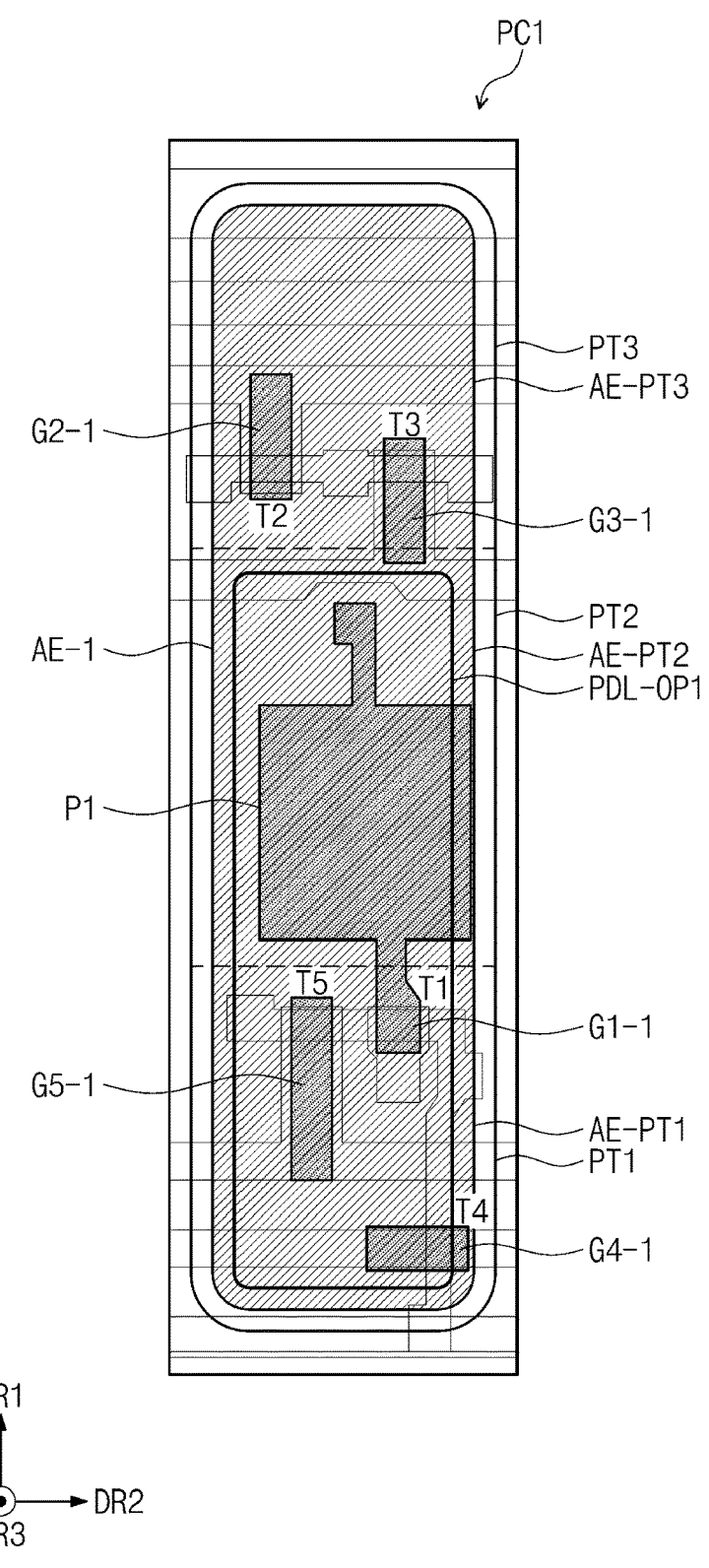
FIG. 9A is a schematic plan view showing components of a display panel according to an embodiment of the disclosure.
Figure 9B:
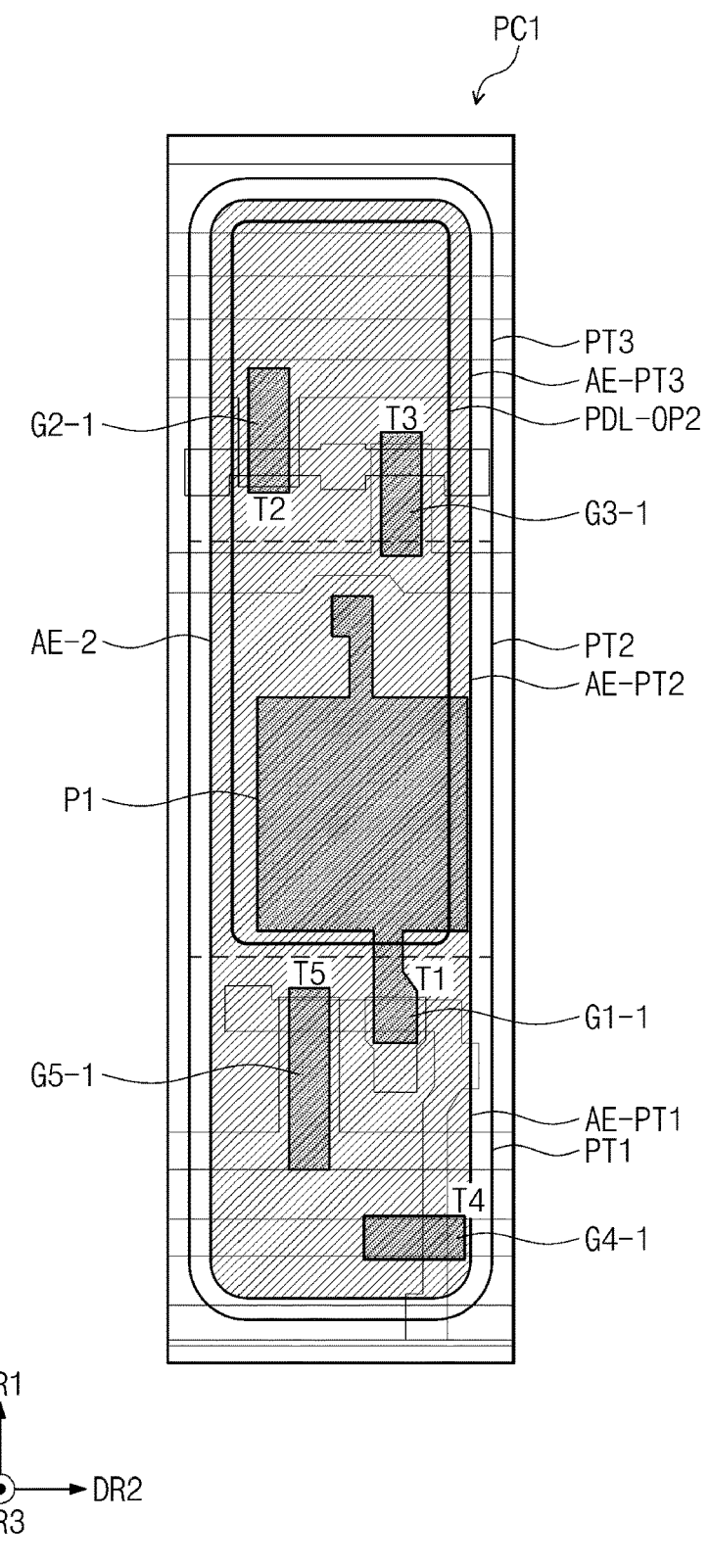
FIG. 9B is a schematic plan view showing components of a display panel according to an embodiment of the disclosure.

FIGS. 9A and 9B are schematic plan views showing components of a display panel according to an embodiment of the disclosure. To be specific, FIG. 9A is a plan view of an embodiment enlarging the first pixel circuit PC1 of the first pixel circuit unit PCU1, the first anode electrode AE-1, and the first pixel opening PDL-OP1 shown in FIG. 6. FIG. 9B is a plan view of an embodiment enlarging the first pixel circuit PC1 of the second pixel circuit unit PCU2, the second anode electrode AE-2, and the second pixel opening PDL-OP2 shown in FIG. 6.

Referring to FIGS. 6 and 9A together, the first anode electrode AE-1 and the first pixel opening PDL-OP1 according to an embodiment may overlap the first pixel circuit PC1 in plan view. To be specific, the first anode electrode AE-1 may be disposed to overlap the first portion PT1, the second portion PT2, and the third portion PT3 of the first pixel circuit PC1. For example, the first anode electrode AE-1 may include a first electrode portion AE-PT1 overlapping the first portion PT1, a second electrode portion AE-PT2 overlapping the second portion PT2, and a third electrode portion AE-PT3 overlapping the third portion PT3.

In contrast, the first pixel opening PDL-OP1 may be disposed to overlap the first portion PT1 and the second portion PT2 of the first pixel circuit PC1, and to not overlap the third portion PT3.

Referring to FIGS. 6 and 9B together, the second anode electrode AE-2 and the second pixel opening PDL-OP2 according to an embodiment may overlap the first pixel circuit PC1 in plan view. To be specific, the second anode electrode AE-2 may be disposed to overlap the first portion PT1, the second portion PT2, and the third portion PT3 of the first pixel circuit PC1. In contrast, the second pixel opening PDL-OP2 may be disposed to overlap the second portion PT2 and the third portion PT3 of the first pixel circuit PC1, and to not overlap the first portion PT1.

Referring to FIGS. 9A and 9B together, the first pixel opening PDL-OP1 and the second pixel opening PDL-OP2 may overlap different portions of the upper gate G1-1 of the first transistor T1. Accordingly, an area in which the first pixel opening PDL-OP1 and the upper gate G1-1 of the first transistor T1 overlap may be different from an area in which the second pixel opening PDL-OP2 and the upper gate G1-1 of the first transistor T1 overlap.

However, the first anode electrode AE-1 and the second anode electrode AE-2 may be disposed at the same position in the first pixel circuit PC1, and accordingly, an area in which the first anode electrode AE-1 and the upper gate G1-1 of the first transistor T1 overlap may be equal to an area in which the second anode electrode AE-2 and the upper gate G1-1 of the first transistor T1 overlap. Accordingly, sizes of the first gap capacitor C1 and the second gap capacitor C2 described above in FIG. 5 may be equal.

The display panel DP according to an embodiment of the disclosure may form the first and second pixel openings PDL-OP1 and PDL-OP2 as described above with reference to FIG. 6, but the area in which the first anode electrode AE-1 and the upper gate G1-1 of the first transistor T1 overlap and an area in which the second anode electrode AE-2 and the upper gate G1-1 of the first transistor T1 overlap may be equal, so that the size of the gap capacitor Cga (see FIG. 2) between adjacent pixels may be substantially the same. Accordingly, even in case that the gap capacitor Cga (see FIG. 2) is generated, the deviation of the storage capacitor Cst (see FIG. 2) between adjacent pixels may be substantially zero.

Figure 10:
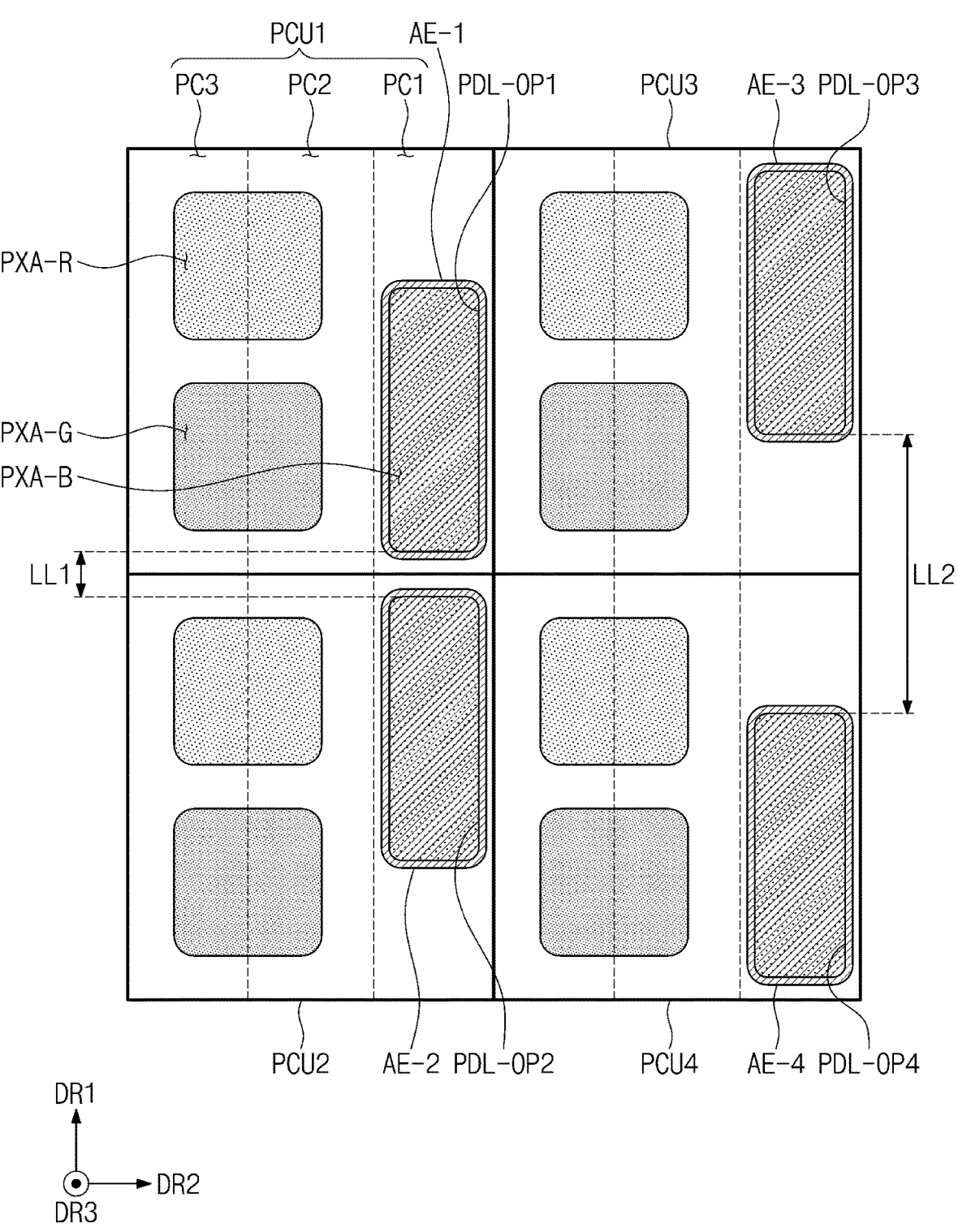
FIG. 10 is a schematic plan view of a display panel according to a Comparative Example.
Figure 11A:
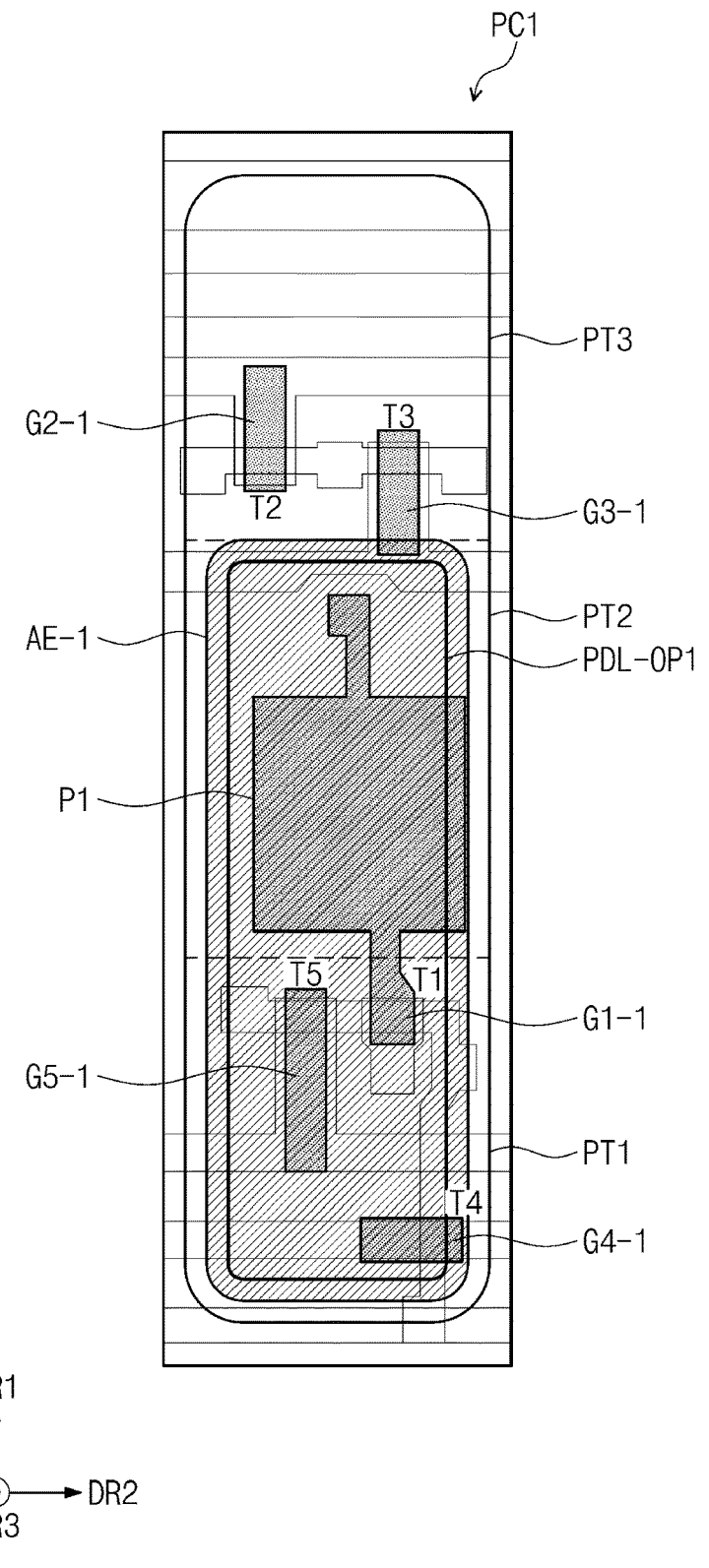
FIGS. 11A and 11B are schematic plan views showing components of a display panel according to the Comparative Example.
Figure 11B:
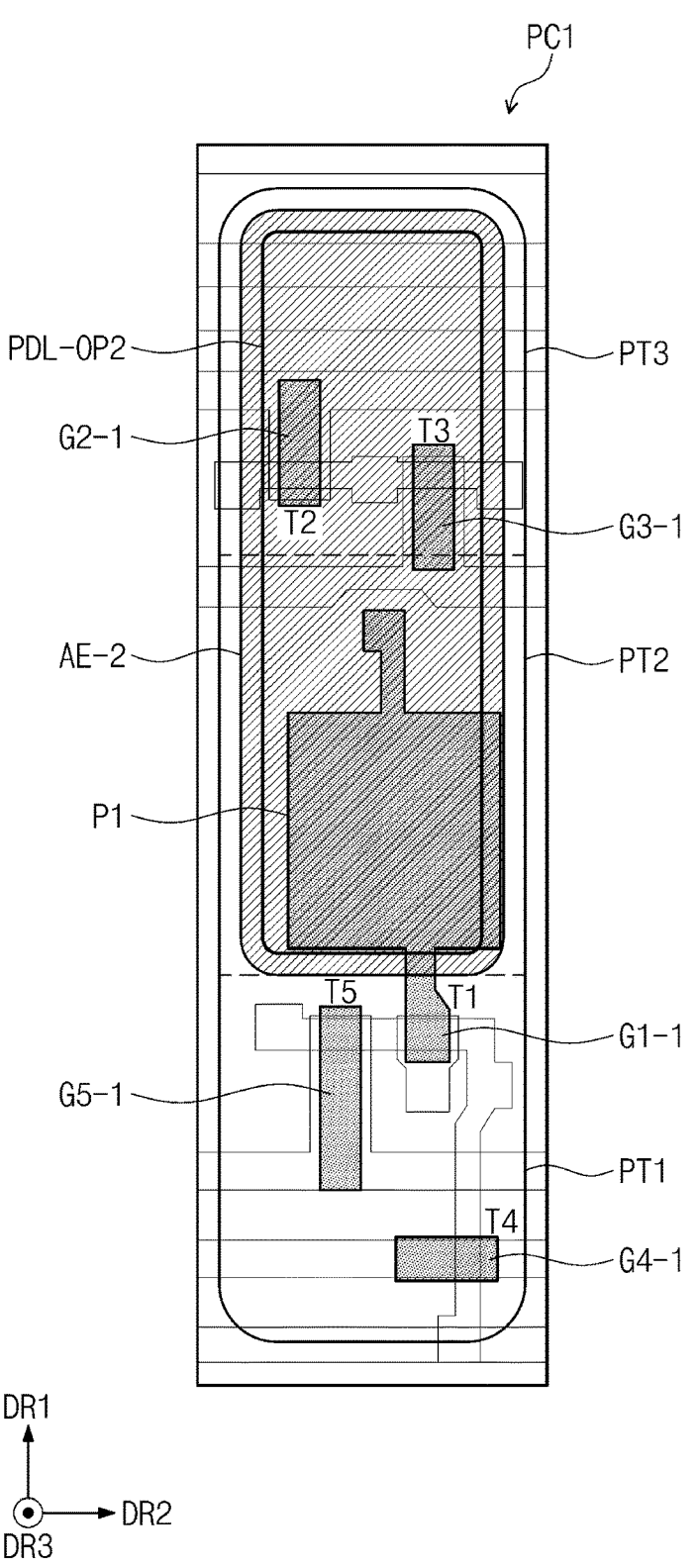

FIG. 10 is a schematic plan view of a display panel according to a Comparative Example. FIGS. 11A and 11B are schematic plan views showing components of a display panel according to the Comparative Example.

In the Comparative Example of FIG. 10, sizes and arrangement positions of the first to fourth anode electrodes AE-1, AE-2, AE-3, and AE-4 are changed compared to an embodiment of FIG. 6. To be specific, the first to fourth anode electrodes AE-1, AE-2, AE-3, and AE-4 may be in the form to surround each of the first to fourth pixel openings PDL-OP1, PDL-OP2, PDL-OP3, and PDL-OP4. Accordingly, compared to the first to fourth anode electrodes AE-1, AE-2, AE-3, and AE-4 shown in FIG. 6, the first and third anode electrodes AE-1 and AE-3 may be disposed at a lower end of the first pixel circuit PC1, and the second and fourth anode electrodes AE-2 and AE-4 may be disposed at an upper end of the first pixel circuit PC1.

FIG. 11A is a plan view of an embodiment enlarging the first pixel circuit PC1 of the first pixel circuit unit PCU1, the first anode electrode AE-1, and the first pixel opening PDL-OP1 shown in FIG. 10. FIG. 11B is a plan view of an embodiment enlarging the first pixel circuit PC1 of the second pixel circuit unit PCU2, the second anode electrode AE-2, and the second pixel opening PDL-OP2 shown in FIG. 10.

Referring to FIGS. 10 and 11A together, the first anode electrode AE-1 and the first pixel opening PDL-OP1 according to an embodiment may overlap the first pixel circuit PC1 in plan view. To be specific, the first anode electrode AE-1 and the first pixel opening PDL-OP1 may each be disposed to overlap the first portion PT1 and the second portion PT2 of the first pixel circuit PC1, and to not overlap the third portion PT3.

Referring to FIGS. 10 and 11B together, the second anode electrode AE-2 and the second pixel opening PDL-OP2 according to an embodiment may overlap the first pixel circuit PC1 in plan view. To be specific, the second anode electrode AE-2 and the second pixel opening PDL-OP2 may each be disposed to overlap the second portion PT2 and the third portion PT3 of the first pixel circuit PC1, and to not overlap the first portion PT1.

For components other than those shown in FIGS. 10, 11A, and 11B, the above descriptions in FIGS. 1 to 9B may be equally applied.

Referring to FIGS. 11A and 11B together, the first anode electrode AE-1 and the second anode electrode AE-2 may overlap different portions of the upper gate G1-1 of the first transistor T1. Accordingly, an area in which the first anode electrode AE-1 and the upper gate G1-1 of the first transistor T1 overlap may be different from an area in which the second anode electrode AE-2 and the upper gate G1-1 of the first transistor T1 overlap. Accordingly, sizes of the first gap capacitor C1 and the second gap capacitor C2 described above in FIG. 5 may be different. For example, display quality may be deteriorated due to a difference in the size of a gap capacitor between adjacent pixels.

The shapes of the light emitting regions PXA-B, PXA-G, and PXA-R according to an embodiment of the disclosure are not limited to those shown in FIG. 6.

Figure 12:
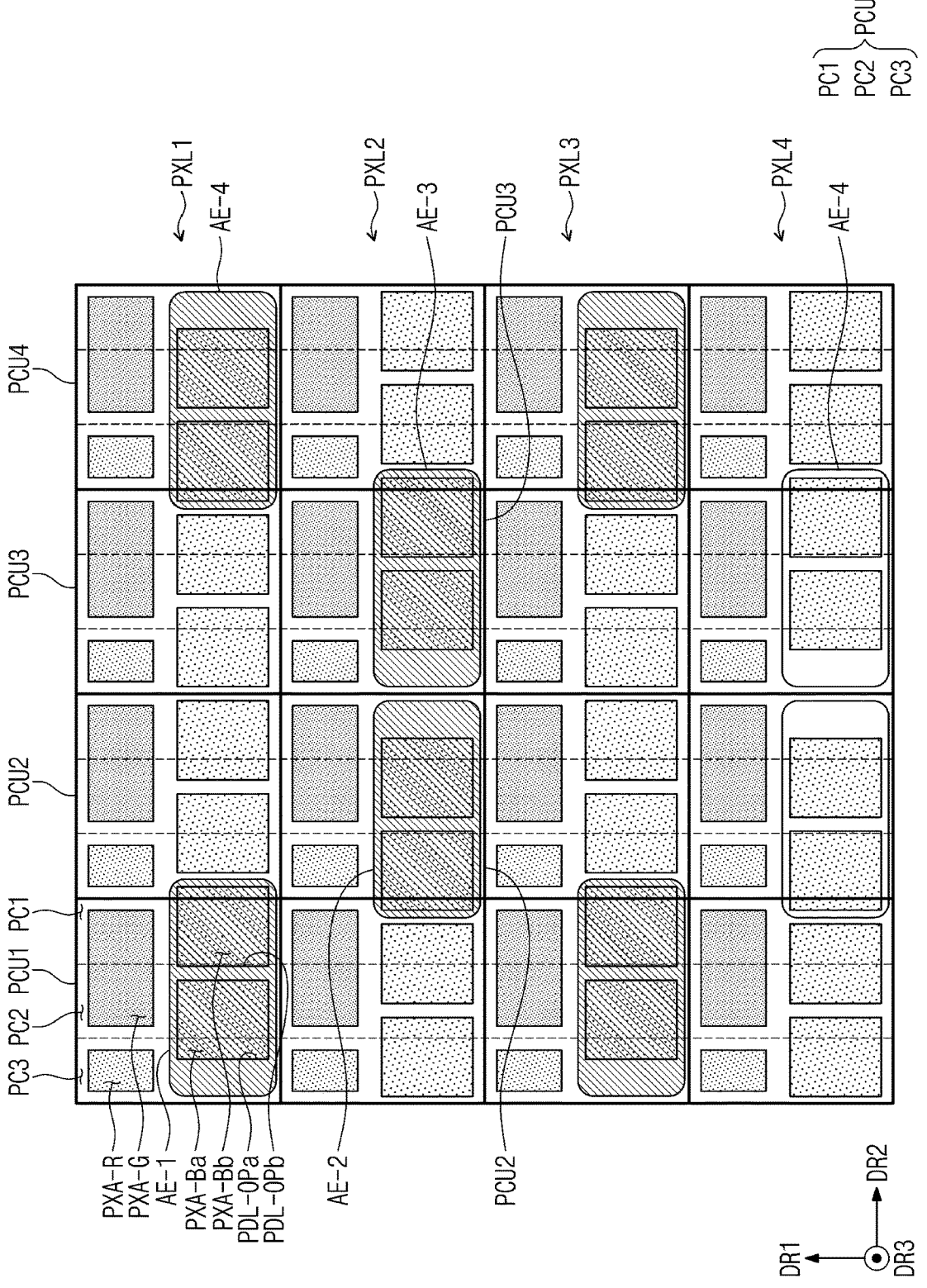
FIG. 12 is a schematic plan view of pixels according to an embodiment of the disclosure.

FIG. 12 is a schematic plan view of pixels according to an embodiment of the disclosure.

Referring to FIG. 12, the display panel according to an embodiment may include first to fourth pixel rows PXL1, PXL2, PXL3, and PXL4, which are sequentially arranged in the first direction DR1. The first to fourth pixel rows PXL1, PXL2, PXL3, and PXL4 each include first to fourth pixel circuit units PCU1, PCU2, PCU3, and PCU4, which are sequentially arranged in the second direction DR2. The first to fourth pixel circuit units PCU1, PCU2, PCU3, and PCU4 may each include first to third pixel circuit units PC1, PC2, and PC3.

On the first to fourth pixel circuit units PCU1, PCU2, PCU3, and PCU4 arranged in a row, first to fourth light emitting element units electrically connected to the first to fourth pixel circuit units PCU1, PCU2, PCU3, and PCU4, respectively, may be disposed along the second direction DR2. The first to fourth light emitting element units may each include a 1-1 light emitting element, a 1-2 light emitting element, a 1-3 light emitting element, and a 1-4 light emitting element.

In FIG. 12, first to fourth light emitting regions PXA-Ba, PXA-Bb, PXA-G, and PXA-R are shown representing the 1-1 light emitting element, the 1-2 light emitting element, the 1-3 light emitting element, and the 1-4 light emitting element. The 1-1 light emitting element and the 1-2 light emitting element each including the first light emitting region PXA-Ba and the second light emitting region PXA-Bb may be driven by the first pixel circuit PC1. For example, anode electrodes included in each of the 1-1 light emitting element and the 1-2 light emitting element may be electrically connected to each other or have a single-body shape. FIG. 12 shows an embodiment that the first anode electrode AE-1 is provided in common to the 1-1 light emitting element and the 1-2 light emitting element. For example, the first and second light emitting regions PXA-Ba and PXA-Bb may overlap the first anode electrode AE-1 in plan view. The third light emitting element including the third light emitting region PXA-G may be driven by the second pixel circuit PC2. The fourth light emitting element including the fourth light emitting region PXA-R may be driven by the third pixel circuit PC3. In an embodiment, the first light emitting region PXA-Ba and the second light emitting region PXA-Bb may emit blue light, the third light emitting region PXA-G may emit green light, and the fourth light emitting region PXA-R may emit red light. However, embodiments of the disclosure are not limited thereto.

Referring to the first pixel circuit unit PCU1 disposed in the first pixel row PXL1 and the first to fourth light emitting regions PXA-Ba, PXA-Bb, PXA-G, and PXA-R disposed on the first pixel circuit unit PCU1, the first anode electrode AE-1 may be disposed to overlap the first to third pixel circuits PC1, PC2, and PC3. A 1a pixel opening PDL-OPa may expose a portion of the first anode electrode AE-1 to define the first light emitting region PXA-Ba, and a 1b pixel opening PDL-OPb may expose another portion of the first anode electrode AE-1 to define the second light emitting region PXA-Bb. In an embodiment, the first and second light emitting regions PXA-B a and PXA-Bb may be disposed adjacent to a right side of the first pixel circuit unit PCU1.

Referring to the fourth pixel circuit unit PCU4 disposed in the first pixel row PXL1 and the first to fourth light emitting regions PXA-B a, PXA-Bb, PXA-G, and PXA-R disposed on the fourth pixel circuit unit PCU4, the fourth anode electrode AE-4 may be disposed to overlap the first to third pixel circuits PC1, PC2, and PC3. A 1a pixel opening PDL-OPa may expose a portion of the fourth anode electrode AE-4 to define the first light emitting region PXA-Ba, and a 1b pixel opening PDL-OPb may expose another portion of the fourth anode electrode AE-4 to define the second light emitting region PXA-Bb. In an embodiment, the first and second light emitting regions PXA-B a and PXA-Bb may be disposed adjacent to a left side of the fourth pixel circuit unit PCU4.

In the first pixel circuit unit PCU1 and the fourth pixel circuit unit PCU4 in the first pixel row PXL1, the positions of the first anode electrode AE-1 and the fourth anode electrode AE-4 may not be exactly the same. However, the first anode electrode AE-1 and the fourth anode electrode AE-4 may be disposed in the first pixel row PXL1 such that the area in which the first anode electrode AE-1 overlaps the first conductive pattern P1 (see FIG. 8) may be equal to the area in which the fourth anode electrode AE-4 overlaps the first conductive pattern P1 (see FIG. 8) included in the first pixel circuit PC1.

Accordingly, the deviation of the gap capacitor Cga (see FIG. 2) between the first pixel circuit unit PCU1 and the fourth pixel circuit unit PCU4 in the first pixel row PXL1 may be substantially zero.

The structure of the second pixel row PXL2 may be different from the structure of the first pixel row PXL1.

Referring to the second pixel circuit unit PCU2 disposed in the second pixel row PXL2 and the first to fourth light emitting regions PXA-Ba, PXA-Bb, PXA-G, and PXA-R disposed on the second pixel circuit unit PCU2, the second anode electrode AE-2 may be disposed to overlap the first to third pixel circuits PC1, PC2, and PC3. In an embodiment, the first and second light emitting regions PXA-Ba and PXA-Bb may be disposed adjacent to a left side of the second pixel circuit unit PCU2.

Referring to the third pixel circuit unit PCU3 disposed in the second pixel row PXL2 and the first to fourth light emitting regions PXA-B a, PXA-Bb, PXA-G, and PXA-R disposed on the third pixel circuit unit PCU3, the third anode electrode AE-3 may be disposed to overlap the first to third pixel circuits PC1, PC2, and PC3. In an embodiment, the first and second light emitting regions PXA-Ba and PXA-Bb may be disposed adjacent to a right side of the third pixel circuit unit PCU3.

In the second pixel circuit unit PCU2 and the third pixel circuit unit PCU3 in the second pixel row PXL2, the positions of the second anode electrode AE-2 and the third anode electrode AE-3 may not be exactly the same. However, the second anode electrode AE-2 and the third anode electrode AE-3 may be disposed in the second pixel row PXL2 such that the area in which the second anode electrode AE-2 overlaps the first conductive pattern P1 (see FIG. 8) may be equal to the area in which the third anode electrode AE-3 overlaps the first conductive pattern P1 (see FIG. 8) included in the first pixel circuit PC1.

Accordingly, the deviation of the gap capacitor Cga (see FIG. 2) between the second pixel circuit unit PCU2 and the third pixel circuit unit PCU3 in the second pixel row PXL2 may be substantially zero.

The structure of the third pixel row PXL3 may be different from the structure of the first pixel row PXL1. The structure of the fourth pixel row PXL4 may be different from the structure of the second pixel row PXL2.

A display device according to an embodiment of the disclosure may include two adjacent pixels each including a light emitting element and a pixel circuit. In the two pixels, portions of the anode electrode exposed by a pixel opening may be different from each other. However, the anode electrode included in the light emitting element may be disposed at the same position in the two pixels. Accordingly, the size of a gap capacitor formed between an anode and a gate electrode included in the pixel circuit may be substantially equal in the two pixels. Accordingly, the display device may have improved display quality.

A display device according to an embodiment may have improved display quality.

Although the disclosure has been described with reference to embodiments of the disclosure, it will be understood that the disclosure should not be limited to these embodiments but various changes and modifications can be made by those skilled in the art without departing from the spirit and scope of the disclosure.

Accordingly, the technical scope of the disclosure is not intended to be limited to the contents set forth in the detailed description of the specification.

What is claimed is:
1. A display device comprising:
   a base layer;
   a circuit layer including a 1-1 pixel circuit and a 1-2 pixel circuit, the circuit layer being disposed on the base layer; and
   a light emitting element layer including a first light emitting element, connected to the 1-1 pixel circuit, and a second light emitting element connected to the 1-2 pixel circuit, the first and second light emitting elements are adjacent to one another, emit a same color and each including:
a first electrode;
an emission layer;
a second electrode; and
a pixel defining film including a pixel opening exposing a portion of the first electrode, wherein
the light emitting element layer is disposed on the circuit layer, the 1-1 pixel circuit and the 1-2 pixel circuit each include:
a driving transistor including:
a source;
a drain; and
a gate; and
a gate conductive layer forming the gate,
wherein an area in which the first electrode of the first light emitting element overlaps the gate of the 1-1 pixel circuit in a plan view is equal to an area in which the first electrode of the second light emitting element overlaps the gate of the 1-2 pixel circuit in a plan view, and
in the plan view, the pixel opening of the first light emitting element does not overlap the gate of the 1-1 pixel circuit, and the pixel opening of the second light emitting element overlaps the gate of the 1-2 pixel circuit.

2. The display device of claim 1, wherein
the first electrode of the first light emitting element and the gate of the 1-1 pixel circuit define a first electrode and a second electrode of a first capacitor, respectively, and
the first electrode of the second light emitting element and the gate of the 1-2 pixel circuit define a first electrode and a second electrode of a second capacitor, respectively.

3. The display device of claim 2, wherein
a capacitance of the first capacitor is substantially equal to a capacitance of the second capacitor.

4. The display device of claim 1, wherein
in the plan view, the pixel opening of the first light emitting element overlaps a lower side of the 1-1 pixel circuit, and
in the plan view, the pixel opening of the second light emitting element overlaps an upper side of the 1-2 pixel circuit.

5. The display device of claim 1, wherein
the driving transistor comprises an oxide semiconductor.

6. The display device of claim 1, wherein
the 1-1 pixel circuit is disposed on the 1-2 pixel circuit in a first direction,
the circuit layer further comprises a 1-3 pixel circuit adjacent to the 1-1 pixel circuit in a second direction intersecting the first direction, and a 1-4 pixel circuit adjacent to the 1-2 pixel circuit in the second direction,
the light emitting element layer comprises a third light emitting element disposed on the 1-3 pixel circuit and a fourth light emitting element disposed on the 1-4 pixel circuit,
the third light emitting element and the fourth light emitting element each comprise:
a first electrode;
an emission layer;
a second electrode; and
a pixel defining film including a pixel opening exposing a portion of the first electrode, the 1-3 pixel circuit and the 1-4 pixel circuit each comprise a first portion, a second portion, and a third portion, which are divided in the first direction,
in plan view, the first electrode of the third light emitting element overlaps the first to third portions of the 1-3 pixel circuit,
in plan view, the first electrode of the fourth light emitting element overlaps the first to third portions of the 1-4 pixel circuit,
in plan view, the pixel opening of the third light emitting element overlaps the second portion and the third portion of the 1-3 pixel circuit, and
in plan view, the pixel opening of the fourth light emitting element overlaps the first portion and the second portion of the 1-4 pixel circuit.

7. The display device of claim 1, wherein
the first light emitting element and the second light emitting element emit first light.

8. The display device of claim 7, wherein
the first light emitting element is electrically connected to the 1-1 pixel circuit, and the second light emitting element is electrically connected to the 1-2 pixel circuit.

9. The display device of claim 7, wherein
the light emitting element layer further comprises a fifth light emitting element emitting second light different from the first light and adjacent to the first light emitting element, and
the first light emitting element is connected to the fifth light emitting element.

10. A display device comprising:
a base layer;
a circuit layer including a 1-1 pixel circuit and a 1-2 pixel circuit adjacent to the 1-1 pixel circuit in a first direction, the circuit layer being disposed on the base layer; and
a light emitting element layer including a first light emitting element disposed on the 1-1 pixel circuit and a second light emitting element disposed on the 1-2 pixel circuit, the light emitting element layer being disposed on the circuit layer, wherein
the first light emitting element and the second light emitting element each include:
a first electrode;
an emission layer;
a second electrode; and
a pixel defining film including a pixel opening exposing a portion of the first electrode,
the 1-1 pixel circuit and the 1-2 pixel circuit each include a first portion, a second portion, and a third portion, which are divided in the first direction, the first portion including a driving transistor having a gate,
in a plan view, the first electrode of the first light emitting element overlaps the first to third portions of the 1-1 pixel circuit,
in the plan view, the first electrode of the second light emitting element overlaps the first to third portions of the 1-2 pixel circuit,
in the plan view, the pixel opening of the first light emitting element overlaps the first portion and the second portion of the 1-1 pixel circuit, and
in the plan view, the pixel opening of the second light emitting element overlaps the second portion and the third portion of the 1-2 pixel circuit and does not overlap the first portion of the 1-2 pixel circuit.

11. The display device of claim 10, wherein in the plan view, the pixel opening of the first light emitting element does not overlap the third portion of the 1-1 pixel circuit.

12. The display device of claim 10, wherein the 1-1 pixel circuit and the 1-2 pixel circuit each comprise a gate, and a gate conductive layer including the gate, and an area in which the first electrode of the first light emitting element overlaps the gate conductive layer of the 1-1 pixel circuit in the plan view is equal to an area in which the first electrode of the second light emitting element overlaps the gate conductive layer of the 1-2 pixel circuit in the plan view.

13. The display device of claim 12, wherein the driving transistor is an oxide semiconductor.

14. The display device of claim 10, wherein the 1-1 pixel circuit is disposed on the 1-2 pixel circuit in the first direction;

the circuit layer further comprises a 1-3 pixel circuit adjacent to the 1-1 pixel circuit in a second direction intersecting the first direction, and a 1-4 pixel circuit adjacent to the 1-2 pixel circuit in the second direction, the light emitting element layer comprises a third light emitting element disposed on the 1-3 pixel circuit and a fourth light emitting element disposed on the 1-4 pixel circuit, the third light emitting element and the fourth light emitting element each comprise a first electrode, an emission layer, a second electrode, and a pixel defining film including a pixel opening exposing a portion of the first electrode, the 1-3 pixel circuit and the 1-4 pixel circuit each comprise a first portion, a second portion, and a third portion, which are divided in the first direction, in plan view, the first electrode of the third light emitting element overlaps the first to third portions of the 1-3 pixel circuit, in plan view, the first electrode of the fourth light emitting element overlaps the first to third portions of the 1-4 pixel circuit, in plan view, the pixel opening of the third light emitting element overlaps the second portion and the third portion of the 1-3 pixel circuit, and in plan view, the pixel opening of the fourth light emitting element overlaps the first portion and the second portion of the 1-4 pixel circuit.

15. The display device of claim 10, wherein the first light emitting element and the second light emitting element emit first light.

16. The display device of claim 15, wherein the first light emitting element is electrically connected to the 1-1 pixel circuit, and the second light emitting element is electrically connected to the 1-2 pixel circuit.

17. The display device of claim 15, wherein the light emitting element layer further comprises a fifth light emitting element emitting second light different from the first light and adjacent to the first light emitting element, and the first light emitting element is connected to the fifth light emitting element.

18. A display device comprising:

a base layer;

first to fourth pixel circuit units arranged in a direction; and first to fourth light emitting units arranged in the direction and disposed on the first to fourth pixel circuit units, respectively, wherein the first to fourth light emitting units each include:

a 1-1 light emitting element;

a 1-2 light emitting element;

a 1-3 light emitting element; and a 1-4 light emitting element, the 1-1 to 1-4 light emitting elements each include:

a first electrode;

an emission layer;

a second electrode; and a pixel defining film including a pixel opening exposing a portion of the first electrode, the first to fourth pixel circuit units each include a first pixel circuit electrically connected to the 1-1 light emitting element and the 1-2 light emitting element, a second pixel circuit electrically connected to the 1-2 light emitting element, and a third pixel circuit electrically connected to the 1-3 light emitting element, the first to third pixel circuits each including:

a driving transistor including:

a source;

a drain; and a gate, and a gate conductive layer including the gate, and areas in which the first electrode of the 1-1 light emitting element and the first electrode of the 1-2 light emitting element overlap the gate of the first pixel circuit in a plan view are equal in the first pixel circuit unit and the fourth pixel circuit unit, and in the plan view, in the first pixel circuit unit, the pixel opening associated with the 1-1 light emitting element does not overlap the gate of the driving transistor connected to the 1-1 light emitting element, and in the fourth pixel unit, the pixel opening associated with the 1-2 light emitting element overlaps the gate of the driving transistor connected to the 1-2 light emitting element.

19. The display device of claim 18, wherein the pixel opening of the 1-1 light emitting element and the pixel opening of the 1-2 light emitting element are disposed at different positions in the first pixel circuit unit and the fourth pixel circuit unit, respectively.

20. The display device of claim 18, wherein the 1-1 light emitting element and the 1-2 light emitting element emit first light, the 1-3 light emitting element emits second light different from the first light, and the 1-4 light emitting element emits third light different from the first light and the second light.

* * * * *